United States Patent
Itoh

(10) Patent No.: US 10,312,374 B2
(45) Date of Patent: *Jun. 4, 2019

(54) CIRCUIT BOARD AND DISPLAY DEVICE

(71) Applicant: Sharp Kabushiki Kaisha, Osaka-shi, Osaka (JP)

(72) Inventor: Ryohki Itoh, Osaka (JP)

(73) Assignee: Sharp Kabushiki Kaisha, Sakai, Osaka (JP)

( * ) Notice: Subject to any disclaimer, the term of this patent is extended or adjusted under 35 U.S.C. 154(b) by 203 days.

This patent is subject to a terminal disclaimer.

(21) Appl. No.: 14/431,027

(22) PCT Filed: Sep. 24, 2013

(86) PCT No.: PCT/JP2013/075613
§ 371 (c)(1),
(2) Date: Mar. 25, 2015

(87) PCT Pub. No.: WO2014/054449
PCT Pub. Date: Apr. 10, 2014

(65) Prior Publication Data
US 2015/0243791 A1  Aug. 27, 2015

(30) Foreign Application Priority Data

Oct. 1, 2012  (JP) ................................ 2012-219855

(51) Int. Cl.
*H01L 29/10*  (2006.01)
*H01L 29/12*  (2006.01)
(Continued)

(52) U.S. Cl.
CPC .... *H01L 29/7869* (2013.01); *G02F 1/136213* (2013.01); *G02F 1/136259* (2013.01);
(Continued)

(58) Field of Classification Search
CPC ......... G02F 1/136213; G02F 1/136218; G02F 1/136259; G02F 1/136286;
(Continued)

(56) References Cited

U.S. PATENT DOCUMENTS 6,714,178 B2 * 3/2004 Koyama .............. G09G 3/3225
345/76
6,771,028 B1 * 8/2004 Winters ............... G09G 3/3233
315/169.1
(Continued)

FOREIGN PATENT DOCUMENTS

JP  10-232412 A  9/1998
JP  2001-281690 A  10/2001
(Continued)

*Primary Examiner* — Meiya Li
(74) *Attorney, Agent, or Firm* — Keating & Bennett, LLP

(57) ABSTRACT

The present invention provides a circuit substrate exhibiting an excellent transmittance and being capable of suitably repair broken conductive lines; and a display device. In the circuit substrate of the present invention, the first conductive lines are arranged in spaces between electrode rows, with two of the first conductive lines per space between the rows, the second conductive lines are arranged in spaces between electrode columns, with one of the second conductive lines in every other space between the columns, the storage capacitor lines including linear portions that extend in the direction in which the second conductive lines extend, in spaces between the electrode columns where the second conductive lines are not arranged, the pattern film including, in a plan view of main surface of the substrate, first linear portions extending in the direction in which the second conductive lines extend, in the spaces between the electrode rows, the first linear portions each including two end portions each overlapping an end portion of a linear portion of one of the storage capacity lines.

15 Claims, 20 Drawing Sheets

(51) Int. Cl.
*H01L 29/786* (2006.01)
*H01L 27/32* (2006.01)
*G02F 1/1362* (2006.01)
*H01L 27/12* (2006.01)

(52) U.S. Cl.
CPC ........ *H01L 27/124* (2013.01); *H01L 27/3265* (2013.01); *G02F 1/136286* (2013.01); *G02F 2001/136218* (2013.01); *H01L 27/1225* (2013.01)

(58) Field of Classification Search
CPC ..... G02F 2001/136218; H01L 27/1225; H01L 27/124; H01L 27/3265; H01L 29/7869
See application file for complete search history.

(56) References Cited

U.S. PATENT DOCUMENTS

| | | | | |
|---|---|---|---|---|
| 7,190,122 B2* | 3/2007 | Winters | ............... | G09G 3/3233 257/72 |
| 7,382,384 B2* | 6/2008 | Winters | ............... | G09G 3/3225 345/694 |
| 7,423,290 B2* | 9/2008 | Yamazaki | ........... | G02F 1/13624 257/59 |
| 7,554,261 B2* | 6/2009 | Winters | ............... | H01L 27/3276 313/500 |
| 7,586,497 B2* | 9/2009 | Boroson | .............. | G09G 3/3225 345/589 |
| 7,710,022 B2* | 5/2010 | Cok | ..................... | G09G 3/3225 313/500 |
| 7,759,676 B2* | 7/2010 | Song | ..................... | H01L 27/283 257/40 |
| 7,969,428 B2* | 6/2011 | Miller | .................. | G09G 3/2003 345/204 |
| 8,022,900 B2* | 9/2011 | Koh | .................... | H01L 27/3276 315/505 |
| 8,384,287 B2* | 2/2013 | Tokuda | ............... | H01L 27/3265 313/500 |
| 8,816,997 B2* | 8/2014 | Tokuda | ................ | G09G 3/3233 345/204 |
| 9,196,635 B2* | 11/2015 | Itoh | ..................... | H01L 27/1225 |
| 2003/0111954 A1* | 6/2003 | Koo | .................... | H01L 27/3276 313/498 |
| 2004/0246015 A1* | 12/2004 | Chung | ................... | G09G 3/006 324/760.02 |
| 2004/0257312 A1* | 12/2004 | Koyama | .............. | G09G 3/3225 345/76 |
| 2005/0128407 A1* | 6/2005 | Lee | ................... | G02F 1/134363 349/141 |
| 2006/0267491 A1* | 11/2006 | Koo | .................... | H01L 27/3276 313/511 |
| 2007/0257945 A1* | 11/2007 | Miller | .................. | G09G 3/2003 345/694 |
| 2007/0257946 A1* | 11/2007 | Miller | .................. | G09G 3/2003 345/694 |
| 2008/0049155 A1 | 2/2008 | Yagi et al. | | |
| 2009/0251615 A1 | 10/2009 | Tsubata | | |
| 2011/0049525 A1 | 3/2011 | Tsubata | | |
| 2011/0122353 A1 | 5/2011 | Tsubata | | |
| 2012/0081626 A1* | 4/2012 | Itoh | ................... | G02F 1/136259 349/33 |
| 2012/0306731 A1* | 12/2012 | Iyama | ............... | G02F 1/136213 345/87 |

FOREIGN PATENT DOCUMENTS

| | | | |
|---|---|---|---|
| JP | 2008-500562 A | 1/2008 | |
| JP | WO 2011001716 A1 * | 1/2011 | ....... G02F 1/136259 |
| WO | 2007/034596 A1 | 3/2007 | |

* cited by examiner

CIRCUIT BOARD AND DISPLAY DEVICE

TECHNICAL FIELD

The present invention relates to a circuit substrate and a display device. More specifically, the present invention relates to a circuit substrate particularly suitable as a constituent component of a display device with a structure in which two conductive lines are arranged in a space between electrode rows, such as a dual gate structure; and a display device.

BACKGROUND ART

Circuit substrates, especially active matrix substrates, have been widely used for active matrix display devices such as liquid crystal display devices and electroluminescence (EL) display devices. In a conventional circuit substrate used for liquid crystal display devices, for example, thin film transistor (TFT) elements are arranged at intersections of multiple gate lines and multiple source lines arranged on the substrate. By the switching function of the TFT elements, image signals are appropriately transmitted to the pixel (electrode) portions connected to the TFT elements.

Here, signal transfer may not succeed when the conductive components are not appropriately formed or damaged to break the conductive lines. From the viewpoint of increasing the yield, circuit substrates desired in various fields are those capable of making suitable repairs by forming new signal transfer routes substitutable for the broken sites with use of components such as repair lines, if necessary.

A conventional liquid crystal display device capable of repairing defects such as breakage of conductive lines is disclosed in, for example, Patent Literature 1. The liquid crystal display device includes: gate bus lines; first storage capacitor bus lines extending along the gate bus lines; data bus lines crossing the gate bus lines; and second storage capacitor bus lines that extend along the data bus lines and are electrically connected to the first storage capacitor bus lines. The first storage capacitor bus lines are formed by using the same conductive film as the gate bus lines or data bus lines. The second storage capacitor bus lines are formed by using the same conductive film as the gate bus lines or data bus lines.

Also, Patent Literature documents 2 to 4, for example, disclose an active matrix substrate and an active matrix liquid crystal display device which are similarly capable of repairing broken conductive lines.

CITATION LIST

Patent Literature

Patent Literature 1: JP 2001-281690 A
Patent Literature 2: JP H10-232412 A
Patent Literature 3: WO 2007/034596
Patent Literature 4: JP 2008-500562 T

SUMMARY OF INVENTION

Technical Problem

In order to deal with breakage of the gate lines or source lines, it is necessary to provide conductive lines (repair lines) capable of functioning as conductive lines for repairing broken conductive lines around the panel as spare lines, or in pixel openings. In the case of arranging repair lines around the panel, these conductive lines provided around the panel are used as the repaired circuit. This unfortunately results in a high resistance in the conductive lines and an increased size of the frame. In the case of arranging repair lines in pixel openings, broken conductive lines can be repaired, but the aperture ratio is low, which leads to a low transmittance.

For example, in the invention described in Patent Literature 1, as illustrated in FIG. 31 of Patent Literature 1, the repaired gate line is formed to go through the storage capacitor bus line 128*a*, the storage capacitor bus line 126*b*, and the storage capacitor bus line 128*b*. Here, repair lines arranged in both the row and column directions are necessary in the transparent portions in the pixels, that is, repair lines are arranged in pixels in parallel with source lines. This arrangement can be improved for better transmittance.

This problem of transmittance is caused by the arrangement of conductive lines capable of functioning as repair lines in the pixel openings, for the case of breakage of the gate lines or source lines.

The invention described in Patent Literature 1 also includes repair lines arranged in the transparent portions of the pixels in parallel with source lines. When a gate line or a source line is broken, a repaired circuit using repair lines is formed by melting the above-described repair lines and two neighboring storage capacitor lines (Cs bus lines) on the respective upper and lower sides of the broken portion of the conductive line (bonding the laminated conductive lines to one another to electrically connect the conductive lines by, for example, laser irradiation) and cutting conductive lines (cutting conductive lines by, for example, laser irradiation). In the invention described in Patent Literature 1, in order to form a route for repairing, conductive lines need to be melted at two sites and cut at six sites, which involves problems that the work is time-consuming, is complicated, and results in a low repair rate.

The inventions described in the other Patent Literature documents also include repair lines in the pixel openings, and thus have a problem of a decreased transmittance. Also, these inventions can be improved so that a circuit substrate suitable for a display device in which two conductive lines are arranged in a space between pixel rows, as in a structure such as a dual gate structure, is produced.

At sites without conductive lines in non-transparent areas in the display region, the light-shielding component such as a black matrix may be damaged to generate pinholes (hereinafter, also referred to as defect sites) to result in low display qualities. The inventions described in the above-described Patent Literature documents therefore can still be improved in terms of reducing such pinholes.

In recent years, middle-sized devices in many cases employ a dual gate structure for reduction of the cost. A dual gate structure involves an increased number of gate lines, and thus the conductive lines are desired to be reduced in thickness such that a high aperture ratio can be achieved. The reduction in thickness, however, is accompanied with an increase in the rate of occurrence of conductive line breakage. The conductive line breakage is more likely to occur in higher-definition devices and large-sized devices. When repair lines are arranged as in the case of Patent Literature 1, the repair lines are arranged in the openings, and thus the aperture ratio is low.

The present invention has been made in view of the above current state of the art, and aims to provide a circuit substrate that has an excellent transmittance and is capable of suitably repairing broken conductive lines; and a display device.

Solution to Problem

The present inventor has made various studies on circuit substrates and display devices which have an excellent transmittance and are capable of shielding the defect sites in the light-shielding component from light and suitably repairing broken conductive lines by using a pattern film, especially in the case of employing a structure in which two conductive lines are arranged in a space between pixel rows, such as a dual gate structure. The inventor has focused on arrangement of a pattern film with linear portions extending along the conductive lines which cross the above-described two conductive lines arranged in a space between pixels in the circuit substrate. As a result, the inventor has found that, when two ends of each linear portion are each made to overlap an end of a linear portion of a storage capacitor line, the pattern film and the storage capacitor lines can be electrically connected in a suitable manner in repair of a broken conductive line, and thus suitable repair can be achieved. As a result, the present inventor has arrived at solving the above problems, thereby completing the present invention.

That is, one aspect of the present invention is a circuit substrate including: multiple electrodes arranged in a matrix; multiple first conductive lines and multiple second conductive lines crossing the first conductive lines; multiple storage capacitor lines extending in the direction in which the first conductive lines extend; multiple thin-film transistor elements each including a drain electrode; and a pattern film, the multiple electrodes electrically connected to the respective drain electrodes, the first conductive lines being arranged in spaces between electrode rows, with two of the first conductive lines per space between the rows, the second conductive lines being arranged in spaces between electrode columns, with one of the second conductive lines in every other space between the columns, the storage capacitor lines including linear portions that extend in the direction in which the second conductive lines extend, in spaces between the electrode columns where the second conductive lines are not arranged, the pattern film including, in a plan view of main surface of the substrate, first linear portions extending in the direction in which the second conductive lines extend, in the spaces between the electrode rows, the first linear portions each including two end portions each overlapping an end portion of a linear portion of one of the storage capacitor lines.

Preferably, the circuit substrate further includes an insulating film, and in the circuit substrate, the two ends of each first linear portion of the pattern film each overlap an end portion of a linear portion of one of the storage capacitor lines with the insulating film in between.

Preferably, the pattern film further includes second linear portions extending in the direction in which the first conductive lines extend.

Preferably, the circuit substrate further includes a conductive material, and in the circuit substrate, the conductive material has a linear shape extending in the direction in which the first conductive lines extend, and the conductive material includes ends each overlapping one of the second linear portions of the pattern film.

Preferably, one end of the conductive material is electrically connected to one of the second linear portions of the pattern film through a contact hole, and the other end of the conductive material is not electrically connected to the pattern film.

Preferably, each end of the conductive material is electrically connected to one of the second linear portions of the pattern film through a contact hole.

Preferably, the conductive material is not electrically connected to the pattern film.

Preferably, the electrodes are transparent, and the conductive material is formed from the same material as the electrodes.

Preferably, the pattern film is arranged in the same layer as the second conductive lines.

Preferably, the pattern film is arranged in a different layer from the second conductive lines, and the pattern film crosses the second conductive lines in a plan view of the main surface of the substrate.

Preferably, either a set of the first conductive lines or a set of the second conductive lines is a set of gate lines, and the other set is a set of source lines.

Preferably, the pattern film is made of a material containing at least one selected from the group consisting of Al, Cr, Ta, Ti, W, Mo, and Cu.

Preferably, the thin-film transistor elements each contain an oxide semiconductor.

Preferably, the circuit substrate is for display devices, and the electrodes are pixel electrodes.

One aspect of the present invention may be a display device including: the circuit substrate of the present invention; a counter substrate facing the circuit substrate; and a display element sandwiched between the substrates.

One aspect of the present invention may be a pixel defect repair method for repairing pixel defects occurring in a circuit substrate with two conductive lines arranged between electrode rows in a structure such as a dual gate structure, the method including connecting broken conductive lines via a storage capacitor line and a pattern film overlapping the storage capacitor line so as to produce substantially the same electric potential.

The above-described connecting step is preferably performed by melting at least two sites in a region where the pattern film and the conductive lines overlap by laser irradiation so as to electrically connect the pattern film and the conductive lines.

One aspect of the pixel defect repair method for circuit substrates according to the present invention may include a step of separating the pattern film electrically connected to the conductive lines from other pattern films.

One aspect of the present invention may be a method for producing a circuit substrate, including a step of repairing pixel defects by the pixel defect repair method for circuit substrates according to the present invention.

One aspect of the present invention may be a method for producing a display device, including a step of producing a circuit substrate by the pixel defect repair method for circuit substrates according to the present invention.

The aforementioned modes may be employed in appropriate combination as long as the combination is not beyond the spirit of the present invention.

Advantageous Effects of Invention

The circuit substrate and the display device of the present invention have an excellent transmittance and are capable of shielding the defect sites in the light-shielding component from light and suitably repairing broken conductive lines by using a pattern film.

DESCRIPTION OF EMBODIMENTS

Figure 1:
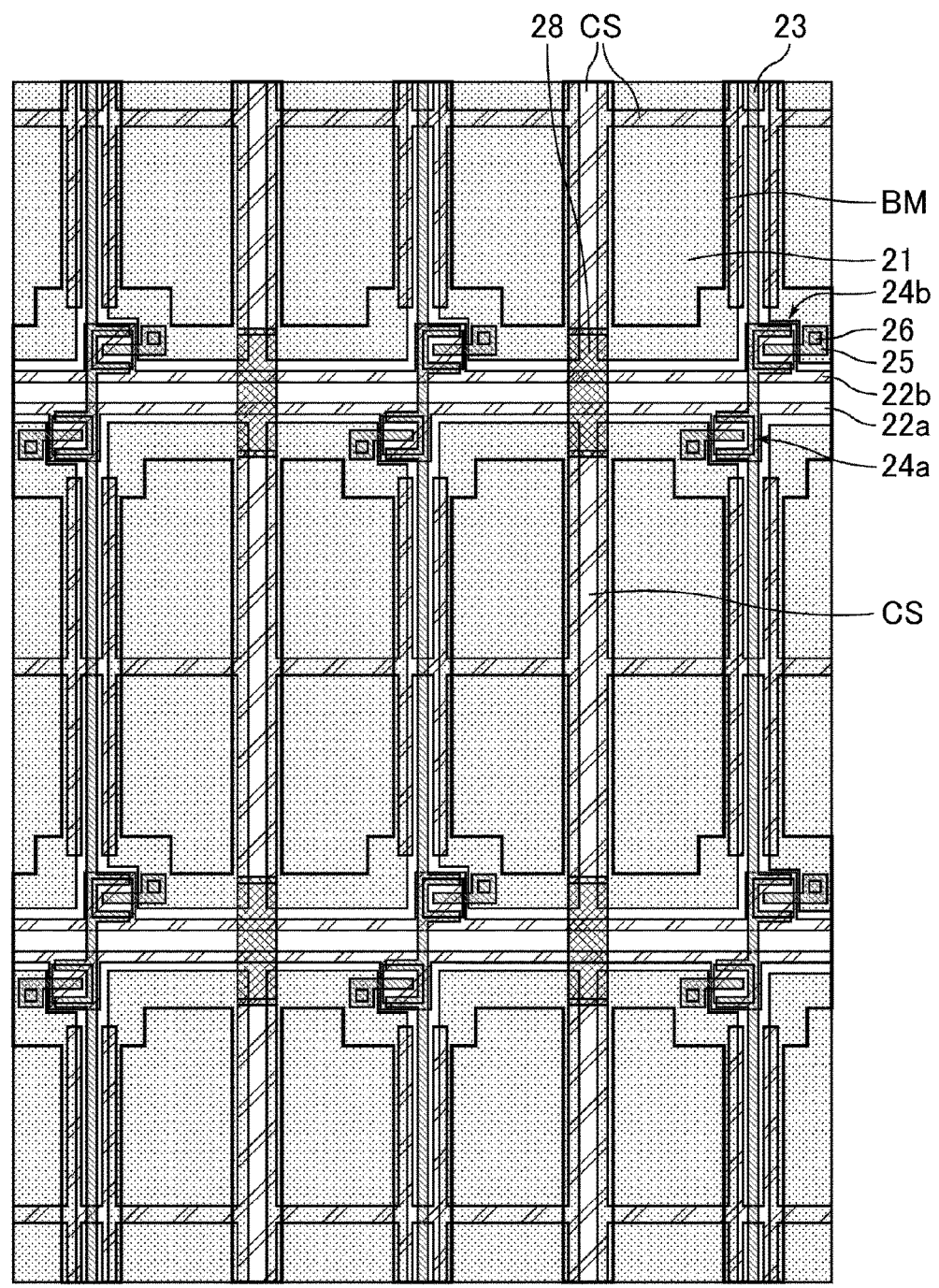
FIG. 1 is an enlarged schematic plan view of a circuit substrate of Embodiment 1.

The present invention will be described in more detail below with reference to the drawings based on embodiments which, however, are not intended to limit the scope of the present invention. A pixel herein may refer to a subpixel, unless otherwise specified. The circuit substrates (first substrates) of the present embodiments, each including thin-film transistors (TFTs), may each be referred to also as a TFT substrate or an array substrate.

In the present embodiments, the circuit substrates are active matrix substrates.

Hereinafter, what is meant by arranging a pattern film in the same layer as the other components is that the pattern film and the other components are in contact with the same component (e.g. insulating film, liquid crystal layer) on the liquid crystal layer side and/or the opposite side of the liquid crystal layer side. Also, in the drawings, reference signs with the same ones digit and the same tens digit indicate the same type of components even if the hundreds digits are different, unless otherwise stated. In the drawings, a circle (○) indicates a site M where components such as conductive lines are melted and electrically connected by laser irradiation, and crossed sign (×) indicates a site CUT where components such as conductive lines are cut by laser irradiation.

Hereinafter, any one of primary arrangements of multiple electrodes (pixel electrodes) in a matrix can be referred to as a pixel row, and any one of the other primary arrangements of pixels crossing the pixel rows (preferably, in substantially perpendicular to the pixel rows) can be referred to as a pixel column. For example, the structure may include two gate lines per space between pixel rows, and one source line in every other space between pixel columns. Here, two source lines may be arranged per space between pixel rows, and one gate line may be arranged in every other space between pixel columns.

Hereinafter, what is meant by extending in a certain direction is, preferably, extending in parallel with the certain direction. Here, being in parallel with the certain direction may be any state that is considered to be substantially parallel in the technical field of the present invention. Also, crossing preferably means crossing substantially orthogonally, for example.

The first conductive lines are typically arranged in the same layer. The second conductive lines are also typically arranged in the same layer.

A Π-shaped Cs structure refers a structure of storage capacitor lines (Cs bus lines) including a horizontally extending part and vertically extending parts that substantially orthogonally cross the horizontally extending part, as in the Greek letter Π, in a display device having a structure in which two conductive lines are arranged in a space between pixel rows, such as a dual gate structure. The later-described embodiments such as Embodiment 1 each employ a Π-shaped Cs structure circuit in which the storage capacitor lines are arranged in the Π-shape.

The present invention will be described in more detail below with reference to the drawings based on embodiments which, however, are not intended to limit the scope of the present invention.

Embodiment 1: Structure in Which a Pattern Film is Arranged in a Space Between Pixel Rows Such That the Pattern Film Overlaps a Storage Capacitor Line in the Upper Pixel Row and a Storage Capacitor Line in the Lower Pixel Row FIG. 1 is an enlarged schematic plan view of a circuit substrate of Embodiment 1. In Embodiment 1, a pattern film 28 was arranged to overlap the storage capacitor line CS in the upper pixel and the storage capacitor line CS in the lower pixel in a dual gate structure. The pattern film 28 is preferably a light-shielding metal used to shield from light a defect site such as a pinhole in the light-shielding component. That is, the pattern film 28 can be, in the dual gate structure, a light-shielding metal for BM pinholes which is provided under the BM (non-transparent portion). When a source line or a gate line is broken, the light-shielding metal is used as a repair line designed to repair the broken conductive line to form a repaired circuit.

One of the two gate lines, namely a gate line 22a, is electrically connected to the gate electrode of a TFT element 24a of a pixel in an odd-numbered pixel column, for example. The other of the two gate lines, namely a gate line 22b, is electrically connected to the gate electrode of a TFT element 24b of a pixel in an even-numbered pixel column, for example. A source line 23 can be electrically connected to a drain lead-out line 25 via the TFT element 24a or the TFT element 24b, which are switching elements. The drain lead-out line 25 is electrically connected to a pixel electrode 21 through a contact hole 26.

The pattern film in Embodiment 1 is arranged under the light-shielding component BM so as not to influence the aperture ratio. Also, in the case that the pattern film is a light-shielding component such as a light-shielding metal and a defect site is generated in the light-shielding component BM, the pattern film can shield the defect site from light. Furthermore, the pattern film in Embodiment 1 is designed to function as a repair line if a conductive line is broken in a display device having a structure in which two conductive lines are arranged in a space between pixel rows, such as a dual gate structure.

Hereinafter, structures resulting from repair of a broken conductive line in the circuit substrate of Embodiment 1 are described as Embodiments 1-1 to 1-3.

Embodiment 1-1

Figure 2:
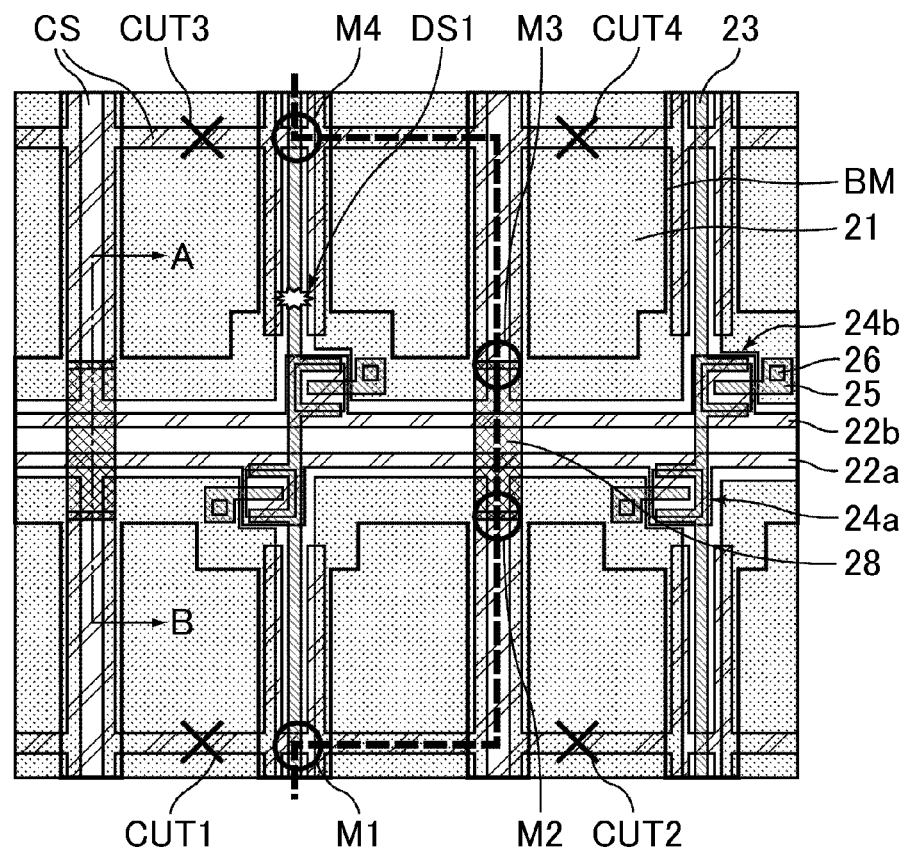
FIG. 2 is an enlarged schematic plan view of a circuit substrate of Embodiment 1-1.

FIG. 2 is an enlarged schematic plan view of a circuit substrate of Embodiment 1-1. Embodiment 1-1 represents a case of repairing a source line broken at a site DS1. In Embodiment 1-1, a repaired circuit indicated by a broken line in FIG. 2 was formed through the following process. That is, the storage capacitor lines were cut at a total of four sites, namely CUT1, CUT2, CUT3, and CUT4, by laser irradiation. By laser irradiation, a source line 23 and a storage capacitor line CS were melted and electrically connected at a site M1, the storage capacitor line CS and the pattern film 28 were melted and electrically connected at a site M2, the pattern film 28 and another storage capacitor line CS were melted and electrically connected at a site M3, and the storage capacitor line CS and the source line 23 were melted and electrically connected at a site M4 (four sites in total were subjected to melting and electrical conduction).

Figure 3:
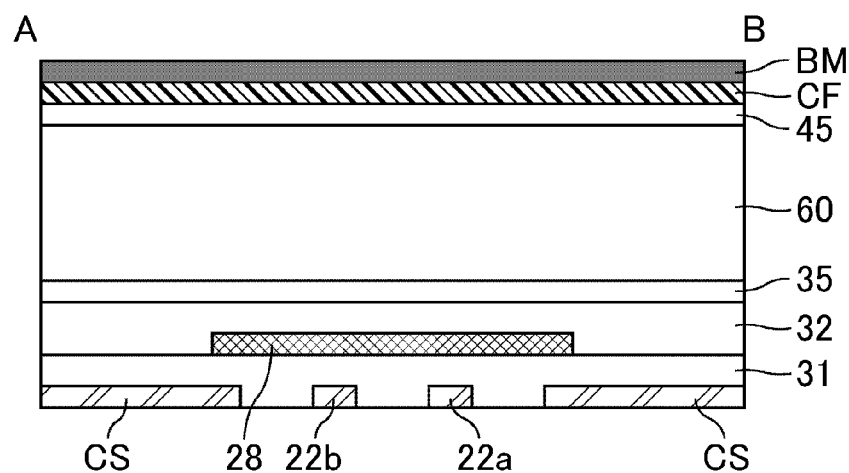
FIG. 3 is a schematic cross-sectional view illustrating a cross section obtained by cutting the circuit substrate illustrated in FIG. 2 along the line A-B.

FIG. 3 is a schematic cross-sectional view illustrating a cross section obtained by cutting the circuit substrate illustrated in FIG. 2 along the line A-B. FIG. 3 illustrates the circuit substrate before a repaired circuit is formed. The pattern film 28 overlaps, at both ends, the storage capacitor lines CS in pixels. The thickness of the first insulating film 31 is preferably 3000 Å or larger. As for the upper limit, the thickness is preferably 5000 Å or smaller. The pattern film 28, when irradiated with laser at each end, pushes the first insulating film 31 aside to reach the overlapping storage capacitor line CS, whereby the melted pattern film 28 and storage capacitor line CS are electrically connected to one another. In Embodiment 1, insulating films needed are only those having been conventionally used for a circuit substrate. Accordingly, a new step or an additional mask exposure step is not required for the conventional method for producing a circuit substrate, which facilitates production of a circuit substrate and does not lengthen the production time. The same effects can be achieved in Embodiments 2 and 3.

Embodiment 1-2

Figure 4:
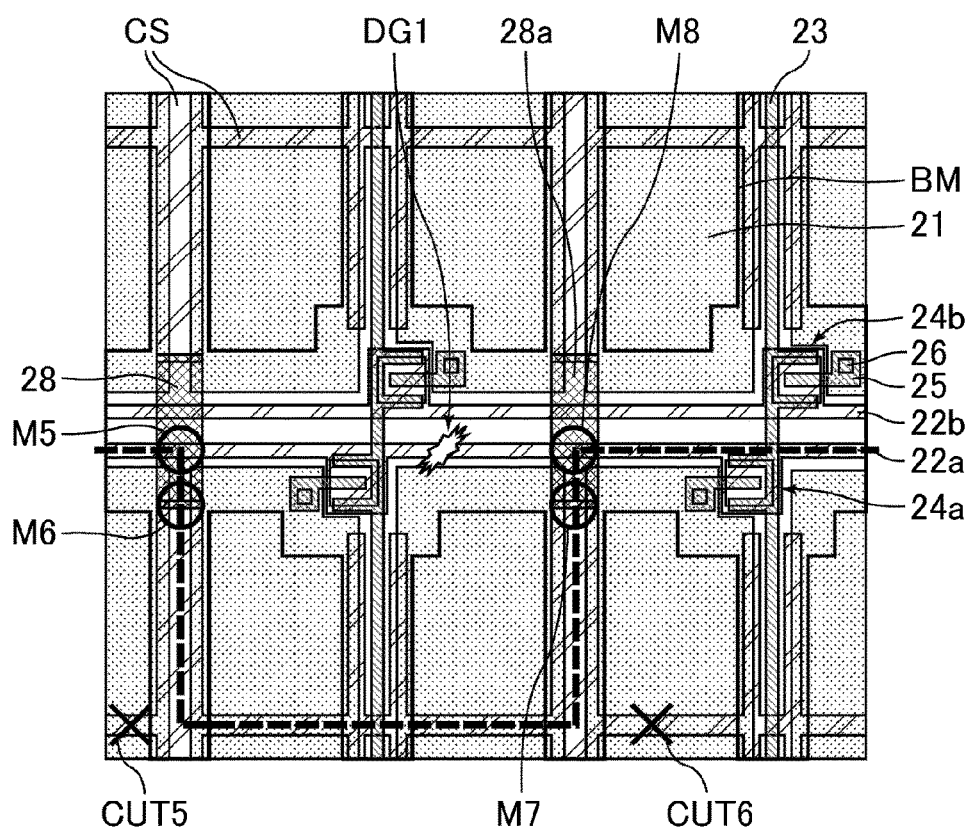
FIG. 4 is an enlarged schematic plan view of a circuit substrate of Embodiment 1-2.

FIG. 4 is an enlarged schematic plan view of a circuit substrate of Embodiment 1-2. Embodiment 1-2 represents a case of repairing a gate line 22a broken at a site DG1. In Embodiment 1-2, a repaired circuit indicated by a broken line in FIG. 4 was formed through the following process. That is, the storage capacitor lines were cut at a total of two sites, namely CUT5 and CUT6, by laser irradiation. By laser irradiation, the gate line 22a and the pattern film 28 were melted and electrically connected at a site M5, the pattern film 28 and a storage capacitor line CS were melted and electrically connected at a site M6, another storage capacitor line CS and a pattern film 28a were melted and electrically connected at a site M7, and the pattern film 28a and the gate line 22a were melted and electrically connected at a site M8 (four sites in total were subjected to melting and electrical conduction).

Embodiment 1-3

Figure 5:
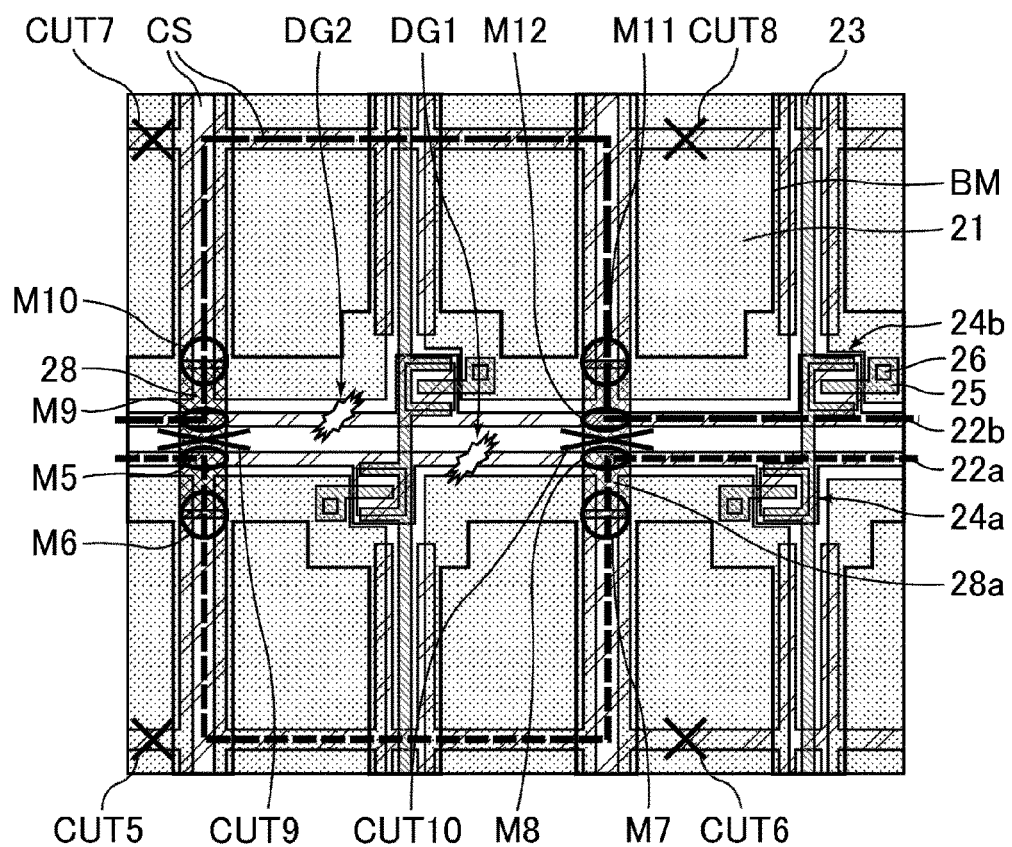
FIG. 5 is an enlarged schematic plan view of a circuit substrate of Embodiment 1-3.

FIG. 5 is an enlarged schematic plan view of a circuit substrate of Embodiment 1-3. Embodiment 1-3 represents a case of repairing simultaneously broken sites in the two respective conductive lines arranged in parallel, i.e., repairing the gate line 22a and the gate line 22b broken respectively at a site DG1 and a site DG2. In Embodiment 1-3, a repaired circuit indicated by a broken line in FIG. 5 was formed through the following process. That is, the storage capacitor lines CS were cut at a total of six sites, namely CUT5, CUT6, CUT7, CUT8, CUT9, and CUT10, by laser irradiation. By laser irradiation, the gate line 22a and the pattern film 28 were melted and electrically connected at a site M5, the pattern film 28 and a storage capacitor line CS were melted and electrically connected at a site M6, another storage capacitor line CS and the pattern film 28a were melted and electrically connected at a site M7, and the pattern film 28a and the gate line 22a were melted and electrically connected at a site M8. Also by laser irradiation, the gate line 22b and the pattern film 28 were melted and electrically connected at a site M9, the pattern film 28 and a storage capacitor line CS were melted and electrically connected at a site M10, another storage capacitor line CS and the pattern film 28a were melted and electrically connected at a site M11, and the pattern film 28a and the gate line 22b were melted and electrically connected at a site M12. The components were melted and electrically conducted at a total of eight sites.

By utilizing components such as a light-shielding metal arranged on the TFT substrate in correspondence with the portions where a light-shielding component (e.g. black matrix arranged on the counter substrate side) is arranged in order to shield defect sites in the light-shielding component in a dual gate structure, the circuit substrate of Embodiment 1 can suitably repair broken gate lines or broken source lines. Here, since the light-shielding metal arranged in a portion not influencing the transmission in the dual gate structure is used, the aperture ratio does not decrease. Furthermore, no spare lines are necessary around the display panel, which makes it possible to narrow the frame. Also, a large space for conductive lines can be taken around the display panel so that the resistance of the conductive lines arranged around the panel can be decreased. When a gate line is repaired, the circuit substrate of Embodiment 1 has advantages that the numbers of times for melting and cutting for repair decrease, the time taken for the repair is reduced, and the work is simple in comparison with the invention described in the patent literatures.

Alternative Examples of Pattern Film in Embodiment 1

Although the pattern film in Embodiment 1 has a pattern shape of a quadrangle (tetragon) as illustrated in FIG. 1, the pattern shape of the pattern film 28 is not particularly limited if the pattern film overlaps an end portion of a linear portion of one of the storage capacitor lines, and the pattern shape may be, for example, a triangle, a semicircle, or a trapezoid.

Figure 6:
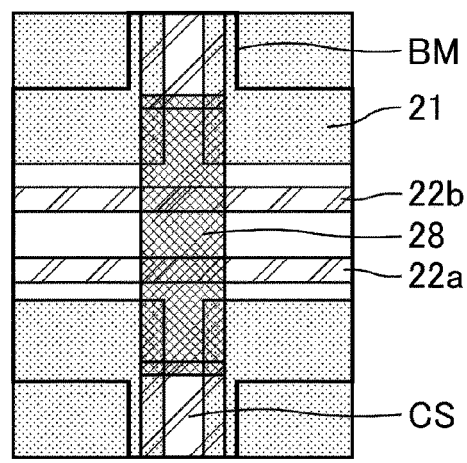
FIG. 6 is a schematic plan view illustrating the shape of a pattern film in Embodiment 1.
Figure 7:
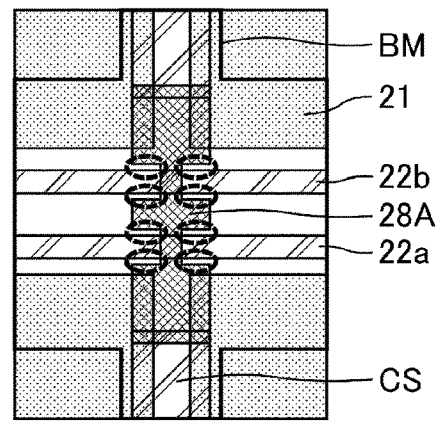
FIG. 7 is a schematic plan view illustrating an alternative example of the shape of the pattern film in Embodiment 1.
Figure 8:
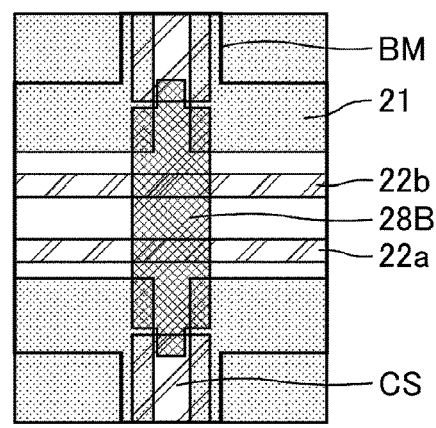
FIG. 8 is a schematic plan view illustrating an alternative example of the shape of the pattern film in Embodiment 1.
Figure 9:
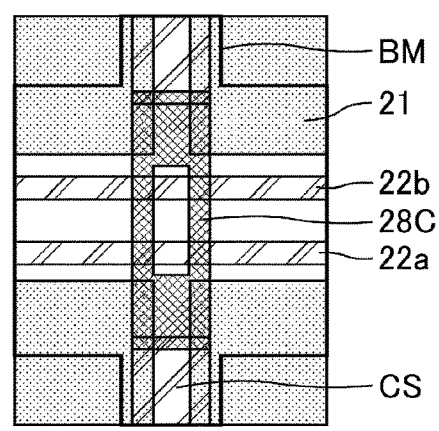
FIG. 9 is a schematic plan view illustrating an alternative example of the shape of the pattern film in Embodiment 1.

Alternative examples of the shape of the pattern film are described below. The shape of the pattern film in Embodiment 1 is not particularly limited if the effects of the present invention can be achieved. FIG. 6 is a schematic plan view illustrating the shape of the pattern film in Embodiment 1. FIGS. 7 to 9 each are a schematic plan view illustrating an alternative example of the shape of the pattern film in Embodiment 1.

The pattern film 28 illustrated in FIG. 6 has a large effect of improving the light-shielding ratio.

A pattern film 28A illustrated in FIG. 7 can reduce the capacitance between the gate lines 22a and 22b and the light-shielding metal (pattern film 28A), reduce the influence of the capacitance on the gate lines 22a and 22b, and sufficiently prevent a decrease in the display qualities because of signal delay or capacitance change.

A pattern film 28B illustrated in FIG. 8 has a large effect of increasing the light-shielding ratio, and can reduce the capacitance between the storage capacitor line CS and the light-shielding metal (pattern film 28B). The pattern film 28B illustrated in FIG. 8 has a higher light-shielding effect than the pattern film 28A illustrated in FIG. 7, and is thus advantageous in shielding a defect site in the light-shielding component from light. The pattern film 28A (light-shielding metal) illustrated in FIG. 7 is narrow only at portions overlapping the gate lines 22a and 22b so that the capacitance between the gate lines 22a and 22b and the pattern film 28A (light-shielding metal) is low. Therefore, light leakage may occur when a gap is formed in the narrow portions (in FIG. 7, eight portions surrounded by the broken lines) and a defect site is generated in the light-shielding portion. Even when such a defect site is generated in the light-shielding portion in any of the eight portions, the pattern film 28B illustrated in FIG. 8 can completely shield the defect site from light.

The pattern film 28C illustrated in FIG. 9 has a design with redundancy, and can reduce the influence of the capacitance on the gate lines 22a and 22b, sufficiently preventing a decrease in the display qualities because of signal delay or capacitance change.

In Embodiment 1, from the viewpoint of electrically connecting the pattern film 28 and the storage capacitor lines CS by laser irradiation, the pattern film 28 is preferably formed to overlap the storage capacitor lines with an insulating film in between so that a region for laser irradiation can be provided. Specifically, the overlapping amount of the pattern film 28 and a storage capacitor line CS in a plan view of the main surface of the substrate is preferably 4 $\mu m^2$ or more. This is because the region to be melted by laser irradiation is desired to be at least about a 2 $\mu m \times 2$ $\mu m$ square. The upper limit for the overlapping amount is preferably 10 $\mu m^2$ square, for example. If the effects of the present invention can be achieved, not all the components are required to be laminated with an insulating film in between in overlapping portions, but it is suitable that the pattern film and the storage capacitor lines are laminated with an insulating film in between in substantially every overlapping portion.

Also, Embodiment 1 can achieve the following effects. The following effects can also be achieved by the later-described embodiments.

Broken conductive lines can be repaired by using, as a repair line, a pattern film arranged under the light-shielding component which does not influence the aperture ratio, for shielding a defect site in the light-shielding component. The aperture ratio therefore does not decrease.

With the pattern film, both broken source lines and broken gate lines can be repaired.

Even when two parallel gate lines break at the same time, both lines can be repaired.

When a broken gate line is repaired, the number of times for cutting is reduced and the repair is easy, compared to the invention described in Patent Literature 1, for example.

Here, in the case of repairing a broken gate line, the breakage can be repaired by two times of cutting and two times of melting, with the structure in the later-described Embodiment 4-2.

A first difference between the storage capacitor lines CS in the present invention and the storage capacitor bus lines in Patent Literature 1 is that the storage capacitor lines CS in the present invention are provided in spaces between pixel columns. The storage capacitor lines CS each have a length of about the vertical length of one pixel, and are separately arranged in the respective pixels. Since the conductive lines are separately arranged in the respective pixels, the number of times for cutting of the conductive lines can be reduced in the repair step for gate lines.

Figure 31:
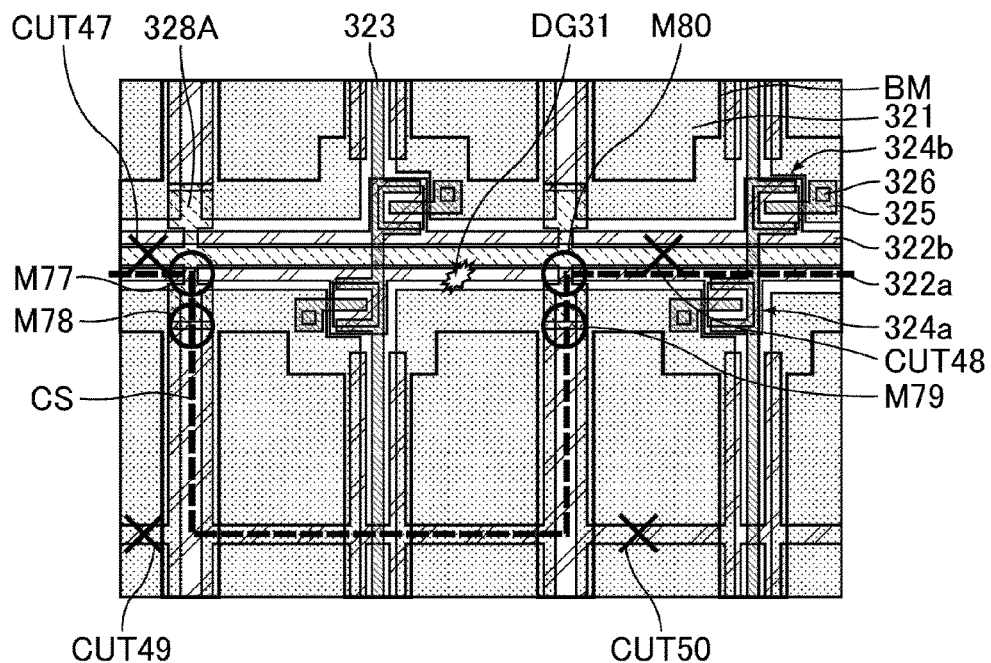
FIG. 31 is an enlarged schematic plan view of a circuit substrate of Embodiment 4-3.

Furthermore, in the repair example illustrated in FIG. 31 of Patent Literature 1, the repaired gate line passes through the lines 128a, 126b, and 128b. Since the lines 128 and 126 are electrically connected through contact holes, the repaired gate line goes through two contact holes between the lines 128a and 126b and between the lines 126b and 128b. Contact holes have a higher resistance than metal lines. Accordingly, Embodiments 1 and 2 of the present invention without contact holes for the storage capacitor lines are advantageous in preventing signal delays.

In the step of repairing broken conductive lines, a smaller number of times for cutting means a lower possibility of failure which leads to an increased repair ratio. Also, the time for work is shortened, and the repair performance within the same time period is improved.

Hereinafter, the preferred structure of Embodiment 1 is described in detail.

The gate lines as the multiple first conductive lines are arranged such that at least two of them are arranged per space between pixel rows. Here, at least two of the first conductive lines may be arranged in every other space between pixel rows, and gate lines may not be arranged in the other spaces between pixel rows. Still, it is preferred that at least two gate lines are arranged per space between pixel rows.

What is meant by two conductive lines extend along one another is that, preferably, the two conductive lines are substantially parallel to one another. Also, crossing preferably means crossing substantially orthogonally, for example.

The gate lines are arranged such that at least two of them extend along one another in a space between pixel rows in a plan view of the main surface of the substrate, but it is preferred that two of the gate lines extend along one another in a space between pixel rows. The at least two conductive lines extending along one another in a space between pixel rows may be a conductive line with a partially separated portion, but are preferably separate two conductive lines that are arranged adjacent to one another.

The circuit substrate of Embodiment 1 has a dual gate structure. The dual gate structure includes twice as many gate lines as a typical circuit substrate does, and half as many source lines as a typical circuit substrate does. Similarly, the dual gate structure includes twice as many gate drivers as a typical circuit substrate does, and half as many source drivers as a typical circuit substrate does. Since source drivers are more expensive than gate drivers, the total cost for the drivers decreases. By applying the concept of the present invention to a circuit substrate having the dual gate structure, the embodiments capable of reducing the cost by decreasing the number of drivers can achieve the effects of the present invention.

There are circuit substrates with a structure in which source lines are arranged such that the source lines in pairs are adjacent to and extending along one another. Circuit substrates having this structure are used for X-ray sensors, for example. The concept of the present invention is applicable to a structure in which conductive lines in pairs are adjacent to and extending along one another. That is, the concept of the present invention is applicable not only to an embodiment in which two gate lines are arranged per space between pixel rows, but also to an embodiment in which other two conductive lines such as two source lines are arranged per space between pixel rows.

The circuit substrate of the present invention is provided thereon with, for example, multiple gate lines, multiple data lines, thin-film transistor elements in each of which a gate electrode is connected to the corresponding gate line and a source electrode is connected to the corresponding source line, and pixel electrodes each connected to a drain electrode or a drain lead-out line of the corresponding thin-film transistor element. For example, the first conductive lines are preferably gate lines, and the second conductive lines are preferably source lines.

The circuit substrate of the present invention with such a structure enables driving control of the thin-film transistor elements by current (gate signals) flowing in the gate lines, and also enables driving control of pixel electrodes by current (data signals) flowing in the source lines, when the thin-film transistor elements are on state.

Preferably, the above-described circuit substrate further includes an insulating film, wherein the two ends of each portion (first linear portion) of the pattern film parallel to the source lines each overlap an end portion of a linear portion of one of the storage capacitor lines with the insulating film in between. Thereby, an alternative route for electrically connecting two separated portions of a broken conductive line can be formed, so that the conductive line can be repaired. Since the circuit substrate of the present invention can repair the conductive lines as described above, the circuit substrate, when used as a panel substrate for a liquid crystal display device, can contribute to an increase in the yield of the liquid crystal display device.

The insulating film for insulating the overlapping portion in the conductive line structure can be a film such as a gate insulating film and a protection film for thin-film transistors. Although the thickness of the insulating film is not particularly limited, the thickness is preferably 5000 Å or smaller in order to easily give conductivity to the overlapping portion in the conductive line structure by laser irradiation, for example.

Preferably, either a set of the first conductive lines or a set of the second conductive lines is a set of gate lines, and the other set is a set of source lines.

The thin-film transistor elements each typically have a gate electrode connected to a gate line, and a source electrode connected to a source line. The above-described circuit substrate is also commonly referred to as an active matrix substrate. The components such as the conductive lines, the pattern film, the thin-film transistor elements, and the insulating films are typically arranged on a transparent substrate such as a glass substrate.

The pattern film is preferably arranged in the same layer as the source lines. In this case, a new insulating film is not necessary for formation of the pattern film, and thus the circuit substrate of the present invention can be more easily produced. The same layer as the source lines herein refers to a layer where the source lines are formed in the multilayered circuit substrate. Typically, when the pattern film and the source lines are arranged in the same layer, the pattern film and the source lines are formed in the same step. The pattern film is preferably formed from the same conductive material in the same step as the source lines and the source electrodes of the thin-film transistor elements, for shortening of the production process and reduction in the production cost.

As long as the circuit substrate and the display device of the present invention essentially include these components, the circuit substrate and the display device are not particularly limited, and may or may not include the other components.

The storage capacitor lines CS are preferably formed from the same conductive material in the same step as the gate lines 22a and 22b and the gate electrodes, for shortening of the production step and reduction in the production cost.

The pattern film is preferably formed from a light-shielding component. The pattern film is preferably made of a metal. More preferably, the pattern film is made of a material containing at least one selected from the group consisting of Al, Cr, Ta, Ti, W, Mo, and Cu. In this case, the pattern film (repair lines) is formed from a material containing a metal having a high melting point. Thereby, in melt processing by a laser, for example, the pattern film can be electrically connected to the storage capacitor lines, gate lines, or source lines easily and reliably compared to a transparent conductive film such as ITO.

Next, each component constituting the active matrix substrate of the present invention is described.

Examples of the material of the substrate include transparent insulating materials such as glass and plastics.

Examples of the material of the above-described conductive lines (gate lines, source lines), gate electrodes, and drain lead-out lines include films of a metal such as titanium (Ti), chromium (Cr), aluminum (Al), molybdenum (Mo), tantalum (Ta), tungsten (W), and copper (Cu), films of alloys thereof, and laminated films thereof. Examples of the method for forming the conductive lines, gate electrodes, and drain lead-out lines include a method of forming a film from any of the above-described materials by a process such as sputtering, and then patterning the film by a process such as photo etching.

Examples of the material of the source electrodes and drain electrodes include $n^+$ amorphous silicon doped with phosphorus or the like material, in the case of using amorphous silicon as the semiconductor layer of the thin-film transistor elements. When an oxide semiconductor is used as the semiconductor layer of thin-film transistor elements, materials such as MoN/Al/MoN and Cu/Ti (Cu is the upper layer and Ti is the lower layer) are suitable. Examples of the method for forming the source electrodes and the drain electrodes include a method of forming a film from any of the above-described materials by a process such as plasma CVD, and then separating the film into source lines and drain lines by a process such as dry etching.

The components in each of the pairs of the gate lines and the gate electrodes, the source lines and the drain lead-out lines, and the source electrodes and the drain electrodes are preferably formed from the same material in the same step, for shortening of the production process and reduction in the production cost. The thickness of the conductive lines, the gate electrodes, and the drain lead-out lines is not particularly limited. Preferably, the lower limit for the thickness is about 1000 Å and the upper limit therefor is about 3000 Å. The thickness of the source electrodes and the drain electrodes is preferably about 500 Å.

Examples of the material of the pixel electrodes include transparent conductive materials such as indium tin oxide (ITO), indium zinc oxide (IZO), tin oxide, and zinc oxide. Examples of the method for forming pixel electrodes include a method of forming a film from any of the above-described materials by a process such as sputtering, and then patterning the film by a process such as photo etching. Examples of the shape of each pixel electrode include a rectangular shape. The thickness of each pixel electrode is not particularly limited, and is from a lower limit of about 1000 Å to an upper limit of about 2000 Å, preferably. Each pixel electrode is preferably connected to the corresponding drain electrode or drain lead-out line through, for example, a contact hole formed in the interlayer insulating film. Examples of the material of the insulating film include acrylic resin, silicon nitride, and silicon oxide.

Preferred modes of the active matrix substrate of the present invention include a mode in which the components are laminated in the following order from the bottom: (1) a substrate, (2) gate lines, gate electrodes, and storage capacitor lines, (3) a (gate) insulating film, (4) a highly resistant semiconductor layer, (5) source lines, source electrodes, drain electrodes, drain lead-out lines, and electrodes on storage capacitor lines, (6) interlayer insulating films (including contact holes), and (7) pixel electrodes, for example.

The thin-film transistor elements in the circuit substrate of the present invention preferably include oxide semiconductors.

Another aspect of the present invention is a display device including the circuit substrate of the present invention. Since pixel defects occurring in the step of producing a circuit substrate can be easily and reliably repaired, the display device of the present invention can provide high display qualities with reduced pixel defects, and can be produced with a high yield. The liquid crystal display device of the present invention as described above is suitable for large-sized liquid crystal TVs or the like device which require prevention of defects, especially point defects.

Suitable examples of the display device of the present invention include liquid crystal display devices and electro luminescence (EL) display devices.

The display device of Embodiment 1 basically includes a TFT substrate (active matrix substrate) which is the circuit substrate in Embodiment 1, a color filter substrate (counter substrate), and a display medium (e.g. liquid crystal) sandwiched between these two substrates. When the concept of the display device of Embodiment 1 is applied to a liquid crystal display device, the alignment mode and the alignment method for the liquid crystal and the method for driving the display are not particularly limited. For example, a twisted nematic (TN) mode, a multi-domain vertical alignment (MVA) mode, an in-plane switching (IPS) mode, a fringe field switching (FFS) mode, or a transverse bend alignment (TBA) mode can be employed. Also, the concept can be suitably applied to those utilizing a polymer sustained alignment (PSA) technology, a photo alignment technology, or a multi-pixel structure. Here, the multi-pixel structure is a structure in which picture element electrodes (subpixel electrodes) are separately individually driven by the respective TFTs. Also, the pixels may each have any shape such as a vertically long shape as illustrated or a horizontally long shape, or may be in a delta arrangement.

The pattern film in the present embodiment can be connected to the corresponding gate lines by laser irradiation, for example.

Accordingly, in the active matrix substrate in the present embodiment, even when a conductive line is broken, the broken conductive line can be repaired by connecting the pattern film and gate lines at at least two sites.

The number of sites where the components (e.g. conductive lines) are melted and electrically connected by laser irradiation in Embodiment 1, and the number of sites where the components (e.g. conductive lines) are cut by laser irradiation are collectively shown in the following Table 1. In the following Tables 1 to 4, the number of sites where the components (e.g. conductive lines) were melted and electrically connected is simply referred to as "melting (number of times)".

TABLE 1

| | Embodiment 1 | Melting (number of times) | Cutting (number of times) |
|---|---|---|---|
| Embodiment 1-1 | Repair of source wiring | 4 | 4 |
| Embodiment 1-2 | Repair of (one) gate wiring | 4 | 2 |
| Embodiment 1-3 | Repair of (two) gate wirings | 8 | 6 |

Embodiment 2: Dual Gate Structure in which the Pattern Film Extends to Spaces Between Gate Lines (in Direction Different by 90° from Embodiment 1) and Transparent Electrodes (Pixel Electrodes) are Arranged on the Pattern Film Between Pixel Rows In Embodiment 2, the pattern film extends to each space between gate lines (the pattern film in Embodiment 2 not only has first linear portions of the pattern film in Embodiment 1 extending in parallel with the source lines but also has second linear portions extending in the direction different by 90° from that of the first linear portions), and transparent electrodes are arranged as a conductive material on the pattern film in each space between pixel rows. The conductive material is not particularly limited, but is preferably a transparent electrode produced from the same material by the same process as the pixel electrodes.

In Embodiment 2, insulating films needed are only those having been conventionally used for a circuit substrate. Accordingly, a new step or an additional mask exposure step is not required for the conventional method for producing a circuit substrate, which facilitates production of a circuit substrate and does not lengthen the production time. When a light-shielding conductive material such as a light-shielding metal is used for the pattern film, the light-shielding region expands, and thus the effect of shielding defect sites in the light-shielding component is large. Also, an area which loses a function as a storage capacitor line CS because of cutting for repair is small, and the repaired pixels can therefore keep the storage capacitance (Cs capacitance). Thereby, the display qualities provided by the repaired pixels can be better than those in Embodiment 1.

Embodiment 2-1

Figure 10:
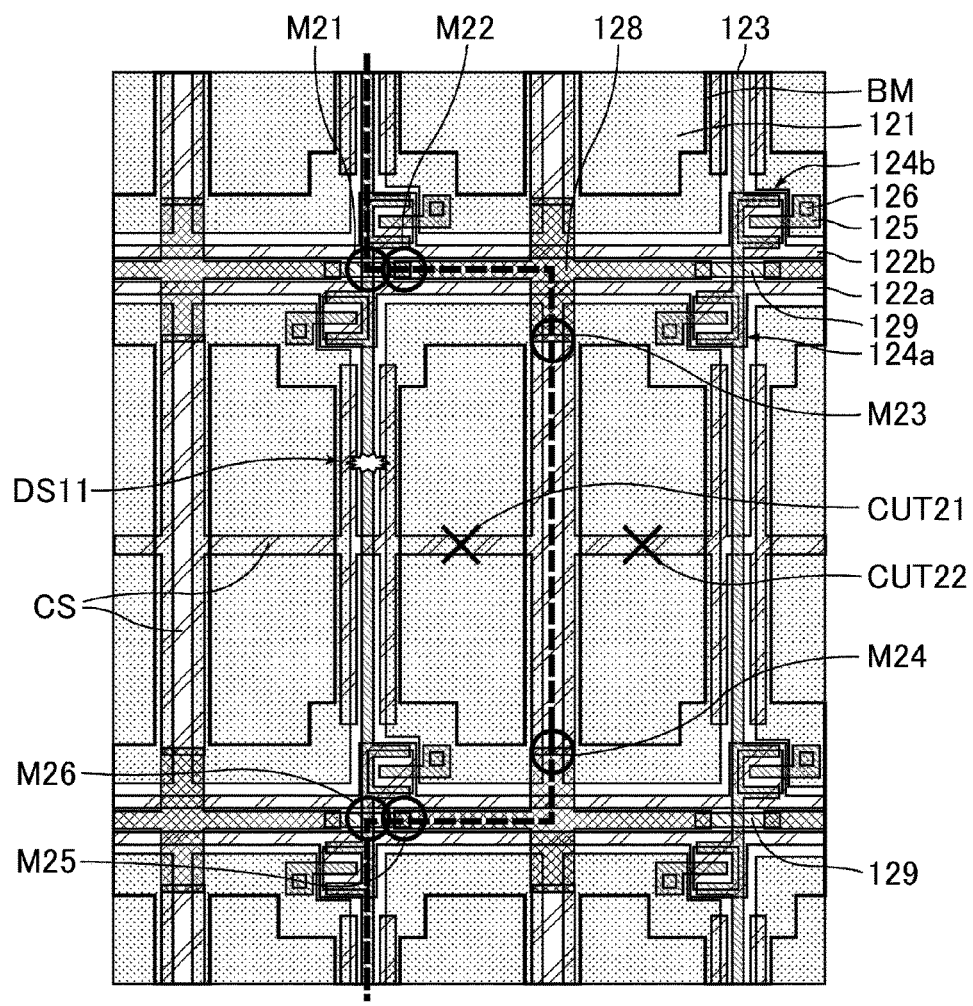
FIG. 10 is an enlarged schematic plan view of a circuit substrate of Embodiment 2-1.

FIG. 10 is an enlarged schematic plan view of a circuit substrate of Embodiment 2-1. Embodiment 2-1 represents a case of repairing a source line broken at a site DS11. In Embodiment 2-1, a repaired circuit indicated by a broken line in FIG. 10 was formed through the following process. That is, the storage capacitor lines were cut at a total of two sites, namely CUT21 and CUT22, by laser irradiation. By laser irradiation, a source line 123 and a conductive material 129, which is a transparent electrode made of a pixel electrode material, were melted and electrically connected at a site M21, the conductive material 129 and a pattern film 128 were melted and electrically connected at a site M22, the pattern film 128 and a storage capacitor line CS were melted and electrically connected at a site M23, the storage capacitor line CS and the pattern film 128 were melted and electrically connected at a site M24, the pattern film 128 and another conductive material 129 were melted and electrically connected at a site M25, and the conductive material 129 and the source line 123 were melted and electrically connected at a site M26 (six sites in total were subjected to melting and electrical conduction).

Embodiment 2-2

Figure 11:
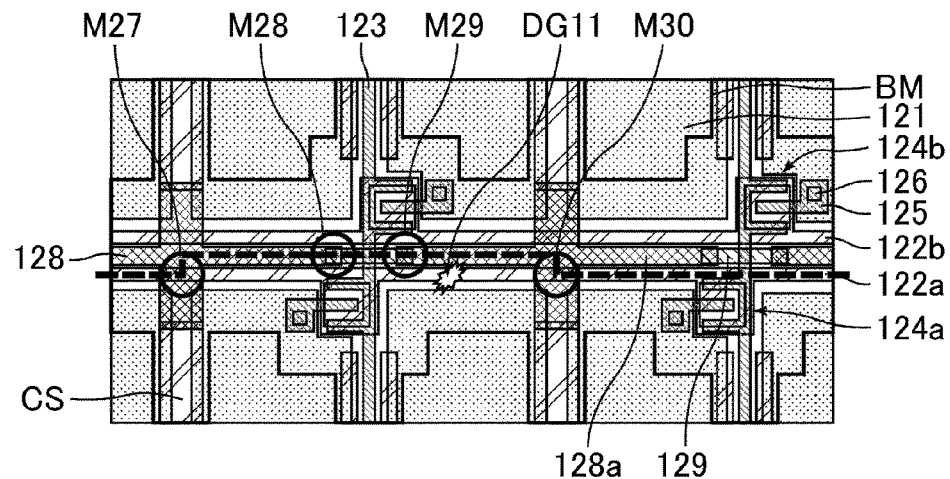
FIG. 11 is an enlarged schematic plan view of a circuit substrate of Embodiment 2-2.

FIG. 11 is an enlarged schematic plan view of a circuit substrate of Embodiment 2-2. Embodiment 2-2 represents a case of repairing the gate line 122a broken at a site DG11 without use of a storage capacitor line CS. In Embodiment 2-2, a repaired circuit indicated by a broken line in FIG. 11 was formed through the following process. That is, by laser irradiation, the gate line 122a and the pattern film 128 were melted and electrically connected at the site M27, a pattern film 128 and a conductive material 129 were melted and electrically connected at a site M28, the conductive material 129 and a pattern film 128a were melted and electrically connected at a site M29, and the pattern film 128a and the gate line 122a were melted and electrically connected at a site M30 (four sites in total were subjected to melting and electrical conduction). In Embodiment 2-2, the conductive lines were not cut.

Embodiment 2-3

Figure 12:
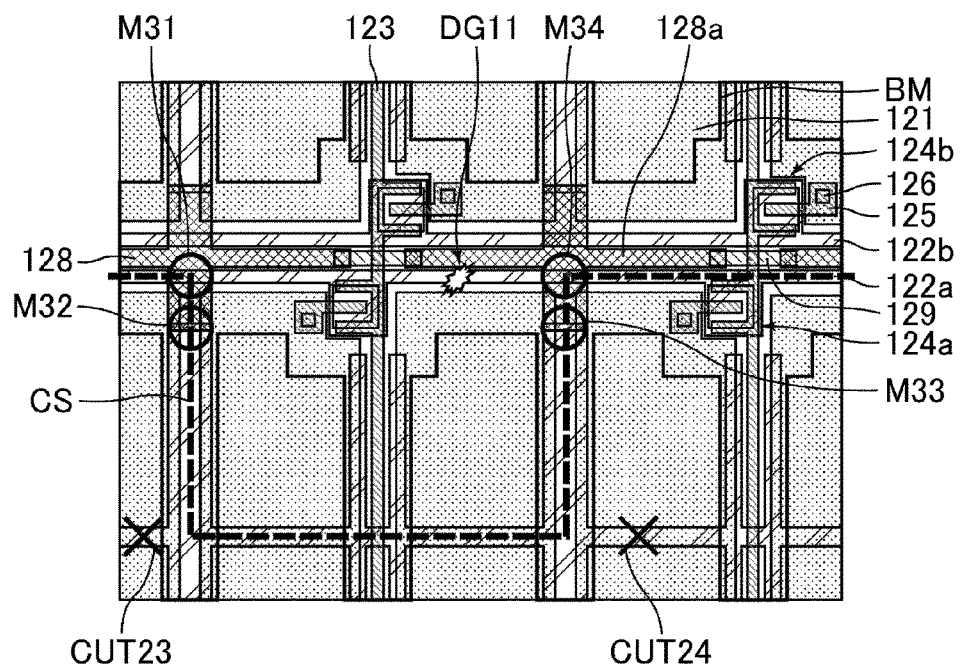
FIG. 12 is an enlarged schematic plan view of a circuit substrate of Embodiment 2-3.

FIG. 12 is an enlarged schematic plan view of a circuit substrate of Embodiment 2-3. Embodiment 2-3 represents a case of repairing the gate line 122a broken at the site DG11 with use of a storage capacitor line CS. In Embodiment 2-3, a repaired circuit indicated by a broken line in FIG. 12 was formed through the following process. That is, the storage capacitor lines were cut at a total of two sites, namely CUT23 and CUT24, by laser irradiation. By laser irradiation, the gate line 122a and a pattern film 128 were melted and electrically connected at a site M31, the pattern film 128 and a storage capacitor line CS were melted and electrically connected at a site M32, another storage capacitor line CS and a pattern film 128a were melted and electrically connected at a site M33, and the pattern film 128a and the gate line 122a were melted and electrically connected at a site M34 (four sites in total were subjected to melting and electrical connection).

Embodiment 2-4

Figure 13:
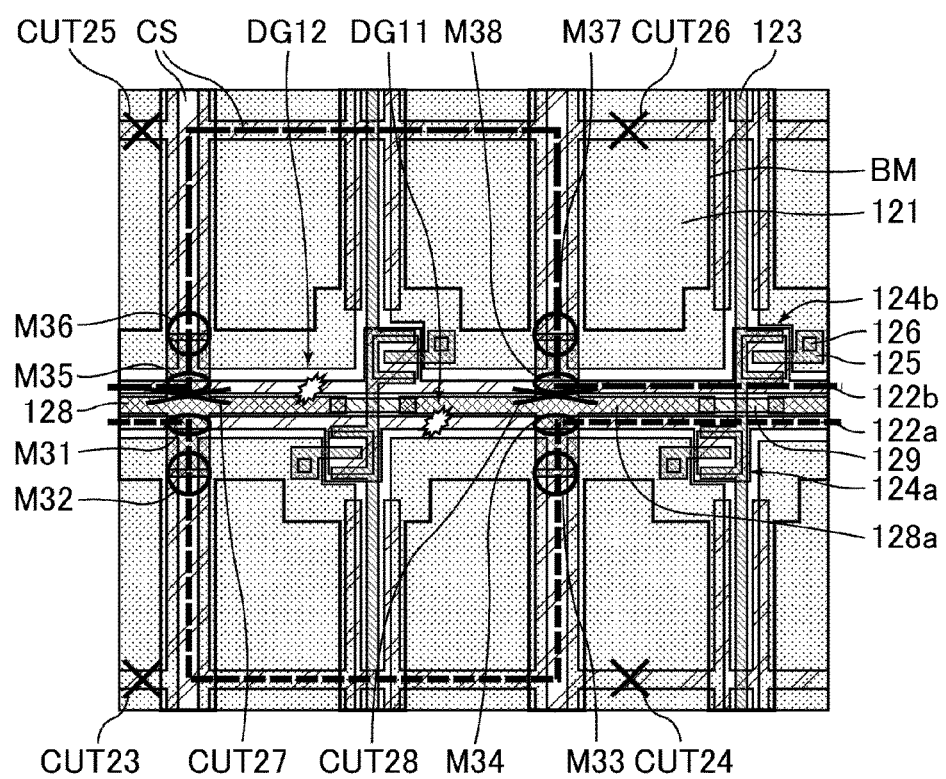
FIG. 13 is an enlarged schematic plan view of a circuit substrate of Embodiment 2-4.

FIG. 13 is an enlarged schematic plan view of a circuit substrate of Embodiment 2-4. Embodiment 2-4 represents a case of repairing simultaneously broken sites in the two respective gate lines arranged in parallel, i.e., repairing the gate line 122a and the gate line 122b broken respectively at the site DG11 and a site DG12. In Embodiment 2-4, a repaired circuit indicated by a broken line in FIG. 13 was formed through the following process. That is, the components were cut at a total of six sites by laser irradiation, i.e., the storage capacitor lines CS were cut at CUT23, CUT24, CUT25, and CUT26, the pattern film 128 was cut at CUT27, and the pattern film 128a was cut at CUT28. Also, by laser irradiation, the gate line 122a and the pattern film 128 were melted and electrically connected at a site M31, the pattern film 128 and a storage capacitor line CS were melted and electrically connected at a site M32, another storage capacitor line CS and a pattern film 128a were melted and electrically connected at a site M33, and the pattern film 128a and the gate line 122a were melted and electrically connected at a site M34. Also, by laser irradiation, the gate line 122b and the pattern film 128 were melted and electrically connected at a site M35, the pattern film 128 and a storage capacitor line CS were melted and electrically connected at a site M36, another storage capacitor line CS and the pattern film 128a were melted and electrically connected at a site M37, and the pattern film 128a and the gate line 122b were melted and electrically connected at a site M38. The components were melted and electrically connected at a total of eight sites.

Alternative Example of Embodiment 2-4

Figure 14:
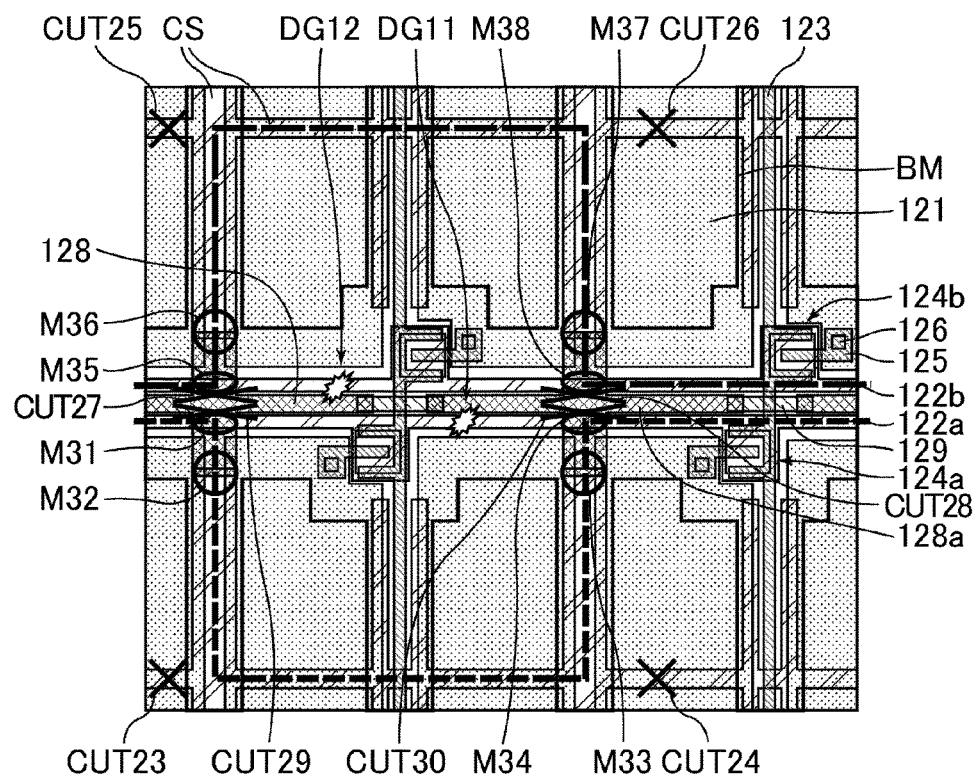
FIG. 14 is an enlarged schematic plan view of a circuit substrate of an alternative example of Embodiment 2-4.

FIG. 14 is an enlarged schematic plan view of a circuit substrate of an alternative example of Embodiment 2-4. In the alternative example of Embodiment 2-4, the pattern film 128 is further cut at CUT29, and the pattern film 128a is further cut at CUT30 in addition to the cutting in Embodiment 2-4 (i.e., the components are cut at a total of eight sites). In a particularly preferred embodiment, for repair of simultaneously broken sites in the two respective gate lines arranged in parallel, the pattern film is cut on the upper and lower sides (e.g. two sites at CUT27 and CUT29) of the broken sites as described above, so that the unnecessary portions of the pattern film are cut away from the signal transfer route as the alternative route resulting from the repair. This is suitably applicable not only to Embodiment 2-4 but also to Embodiment 1-3 and Embodiment 3-3.

The following describes the advantage of cutting the pattern film at two sites, namely on the upper and lower sides, and cutting the unnecessary portion away as illustrated in FIG. 14. For example, when the distance between an Nth gate line and an (N+1)th gate line adjacent to the Nth gate line is 10 µm and the width of the pattern film between these gate lines is 5 µm, the distance between the gate line and the pattern film is 2.5 µm. In such a structure, one gate line has the influence described below on the electric field of another gate line adjacent thereto in any of the following cases (1) to (3). (1) Typical dual gate structure: the distance between an Nth gate line and the (N+1)th gate line is 10 µm, and an influence from one gate line on the electric field of another gate line adjacent thereto is provided through a 10-µm gap. (2) Structure in which the pattern film is cut at two sites, namely on the upper and lower sides, so that the unnecessary region is cut away as illustrated in FIG. 14: substantially the same effect as in the above-described item (1) is achieved. (3) Structure in which the pattern film is cut at either one of the upper and lower sites: in the repair, the signals from one gate line are at the same electrical potential as the pattern film arranged between the gate lines. In this case, the influence of one gate line on the electric field of another gate line adjacent thereto is not provided through a 10-µm gap, but is provided through merely a 2.5-µm gap, which is narrow. Hence, one gate line and another gate line adjacent thereto are apt to be influenced by the electric field of one another. Since this influence can be prevented, cutting the pattern film at two sites on the upper and lower sides as illustrated in FIG. 14 is advantageous.

Alternative Example of Shape of Pattern Film in Embodiment 2

Although the linear portion of the pattern film in Embodiment 2 has a pattern shape of a quadrangle (tetragon) as illustrated in FIG. 10, the pattern shape of the pattern film 128 is not particularly limited if the pattern film overlaps an end portion of a linear portion of one of the storage capacitor lines, and the pattern shape may be, for example, a triangle, a semicircle, or a trapezoid.

Figure 15:
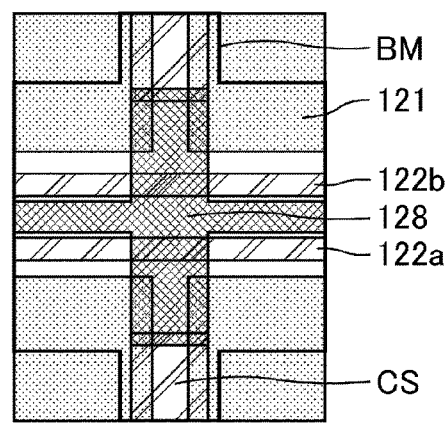
FIG. 15 is a schematic plan view illustrating the shape of a pattern film in Embodiment 2.
Figure 16:
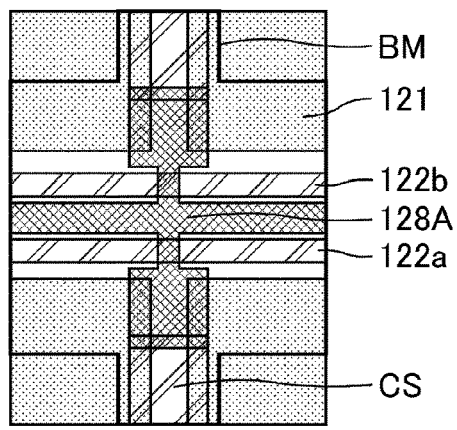
FIG. 16 is a schematic plan view illustrating an alternative example of the shape of the pattern film in Embodiment 2.
Figure 17:
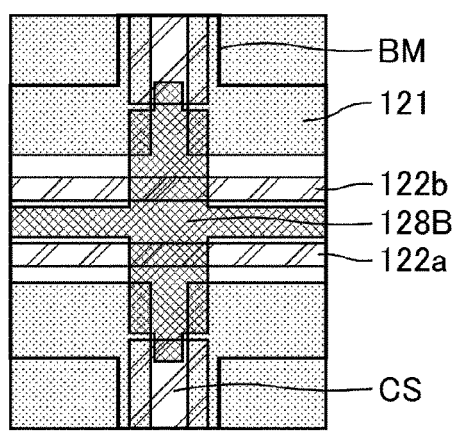
FIG. 17 is a schematic plan view illustrating an alternative example of the shape of the pattern film in Embodiment 2.
Figure 18:
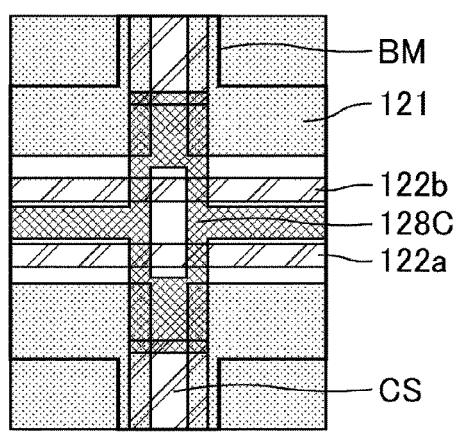
FIG. 18 is a schematic plan view illustrating an alternative example of the shape of the pattern film in Embodiment 2.

Alternative examples of the shape of the pattern film are described. The shape of the pattern film in Embodiment 2 is not particularly limited if the effects of the present invention can be achieved. FIG. 15 is a schematic plan view illustrating the shape of the pattern film in Embodiment 2. FIGS. 16 to 18 are each a schematic plan view illustrating an alternative example of the shape of the pattern film in Embodiment 2.

The pattern film 128 illustrated in FIG. 15 has a large effect of increasing the light-shielding ratio.

The pattern film 128A (light-shielding metal) illustrated in FIG. 16 is narrow only at portions overlapping the gate lines 122a and 122b so that the capacitance between the gate lines 122a and 122b and the pattern film 128A (light-shielding metal) is low. Therefore, the capacitance between the gate lines 122a and 122b and the pattern film 128A (light-shielding metal) can be low, and the influence of the capacitance on the gate lines 122a and 122b can be small. Thereby, it is possible to sufficiently prevent a decrease in the display qualities because of signal delay or capacitance change.

The pattern film 128B illustrated in FIG. 17 has a large effect of increasing the light-shielding ratio, and can reduce the capacitance between the storage capacitor line CS and the pattern film 128B (light-shielding metal). The pattern film 128B illustrated in FIG. 17 has a high light-shielding effect than the pattern film 128A illustrated in FIG. 16, and is thus advantageous in shielding a defect site in the light-shielding component from light. That is, a gap may be formed in the narrow portions of the pattern film 128A illustrated in FIG. 16, but the corresponding portions can be completely shielded from light in the pattern film 28B illustrated in FIG. 8.

The pattern film 128C illustrated in FIG. 18 has a design with redundancy, and can reduce the influence of the capacitance on the gate lines 122a and 122b, sufficiently preventing a decrease in the display qualities because of signal delay or capacitance change.

In Embodiment 2, from the viewpoint of electrically connecting the pattern film 128 and the storage capacitor lines CS by laser irradiation, the pattern film 128 is preferably formed to overlap the storage capacitor lines with an insulating film in between so that a region for laser irradiation can be provided. Specifically, the overlapping amount of the pattern film 128 and a storage capacitor line CS in a plan view of the main surface of the substrate is preferably 4 µm$^2$ or more. This is because the region to be melted by laser irradiation is desired to be at least about a 2 µm×2 µm square. The upper limit for the overlapping amount is preferably 10 µm$^2$, for example. If the effects of the present invention can be achieved, not all the components are required to be laminated with an insulating film in between in overlapping portions, but it is suitable that the pattern film and the storage capacitor lines are laminated with an insulating film in between in substantially every overlapping portion.

The display device of Embodiment 2 also basically includes a TFT substrate (active matrix substrate) as a circuit substrate, a color filter substrate (counter substrate), and a display medium (e.g. liquid crystal) sandwiched between these two substrates.

The alignment mode and the alignment method for the liquid crystal and the method for driving the display are not limited (can be TN, MVA, IPS, FFS, TBA, PSA, photo alignment, or multi-pixel alignment). Also, the pixels may each have any shape such as a vertically long shape or a horizontally long shape, or may be in a delta arrangement.

In a circuit substrate with a dual gate structure, the pattern film is arranged in the source line layer per space between pixel rows. In the same manner as in Embodiment 1, repair lines can be formed using a conventional TFT structure layer (in the production step). Therefore, any new layer formation step (photolithography step) is not necessary, and thus the number of steps does not increase. Also, no new mask is required, and therefore the cost does not increase. When the pattern film arranged under the light-shielding component which does not influence the aperture ratio is used as repair lines for shielding a defect site in the light-shielding component, the gate lines on both the upper and lower sides can be repaired. Furthermore, breakage of the gate lines at any site can be repaired.

The other suitable structures for Embodiment 2 are the same as the above-described suitable embodiments for Embodiment 1, and the embodiments can achieve the same effects as described above.

The number of sites where the components (e.g. conductive lines) are melted and electrically connected by laser irradiation, and the number of sites where the components (e.g. conductive lines) are cut by laser irradiation in Embodiment 2 are collectively shown in the following Table 2.

TABLE 2

| Embodiment 2 | | Melting (number of times) | Cutting (number of times) |
|---|---|---|---|
| Embodiment 2-1 | Repair of source wiring | 6 | 2 |
| Embodiment 2-2 | Repair of (one) gate wiring Without use of storage capacitor wiring | 4 | 0 |
| Embodiment 2-3 | Repair of (one) gate wiring With use of storage capacitor wiring | 4 | 2 |
| Embodiment 2-4 | Repair of (two) gate wirings | 8 | 6 |

Embodiment 3: Dual Gate Structure in which Light-Shielding Metal for Shielding Defect Site in the Light-Shielding Component Between Adjacent Pixels is Electrically Connected to Transparent Electrode (Pixel Electrode Material) Through Protection Film Hole (One Side)

In Embodiment 3, the pattern film extends to each space between gate lines, and transparent electrodes are arranged as a conductive material on the pattern film in each space between pixel rows, as in Embodiment 2. The conductive material is not particularly limited, but is preferably a transparent electrode produced from the same material by the same process as the pixel electrodes.

In Embodiment 3, insulating films needed are only those having been conventionally used for a circuit substrate. Accordingly, a new step or an additional mask exposure step is not required for the conventional method for producing a circuit substrate, which facilitates production of a circuit substrate and does not lengthen the production time. When a light-shielding conductive material such as a light-shielding metal is used for the pattern film, the light-shielding region expands, and thus the effect of shielding defect sites in the light-shielding component is large. Also, an area which loses a function as a storage capacitor line CS because of cutting for repair is small, and the repaired pixels can therefore keep the storage capacitance (Cs capacitance). Thereby, the display qualities provided by the repaired pixels can be better than those in Embodiment 1.

Embodiment 3-1

Figure 19:
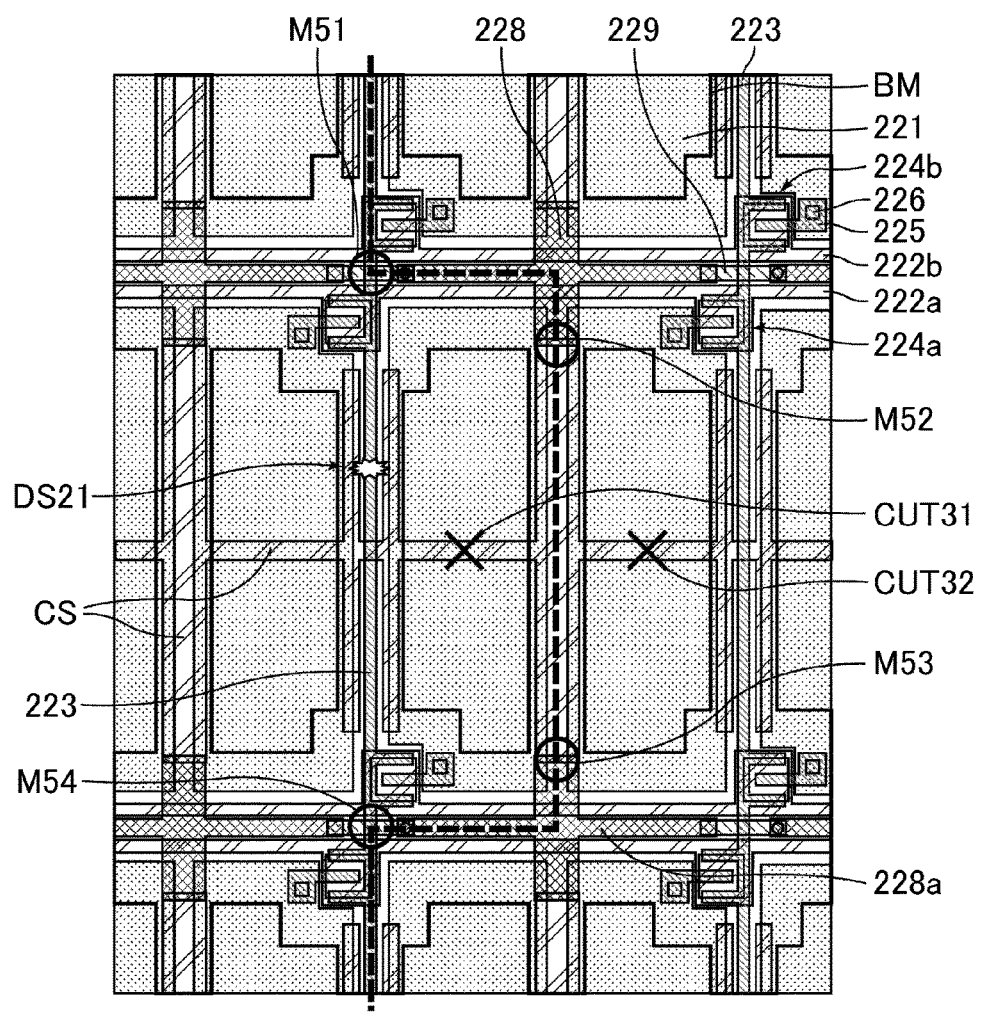
FIG. 19 is an enlarged schematic plan view of a circuit substrate of Embodiment 3-1.

FIG. 19 is an enlarged schematic plan view of a circuit substrate of Embodiment 3-1. Embodiment 3-1 represents a case of repairing a source line broken at a site DS21. In Embodiment 3-1, a repaired circuit indicated by a broken line in FIG. 19 was formed through the following process. That is, the storage capacitor lines were cut at a total of two sites, namely CUT31 and CUT32, by laser irradiation. By laser irradiation, a source line 223 and a conductive material 229, which is a transparent electrode made of a pixel electrode material, were melted and electrically connected at a site M51, the conductive material 229 and a pattern film 228 were electrically connected through a contact hole, the pattern film 228 and a storage capacitor line CS were melted and electrically connected at a site M52, the storage capacitor line CS and a pattern film 228a were melted and electrically connected at a site M53, the pattern film 228a and the conductive material 229 were electrically connected through a contact hole, and the conductive material 229 and the source line 223 were melted and electrically connected at a site M54 (six sites in total were subjected to melting and electrical conduction).

Embodiment 3-2

Figure 20:
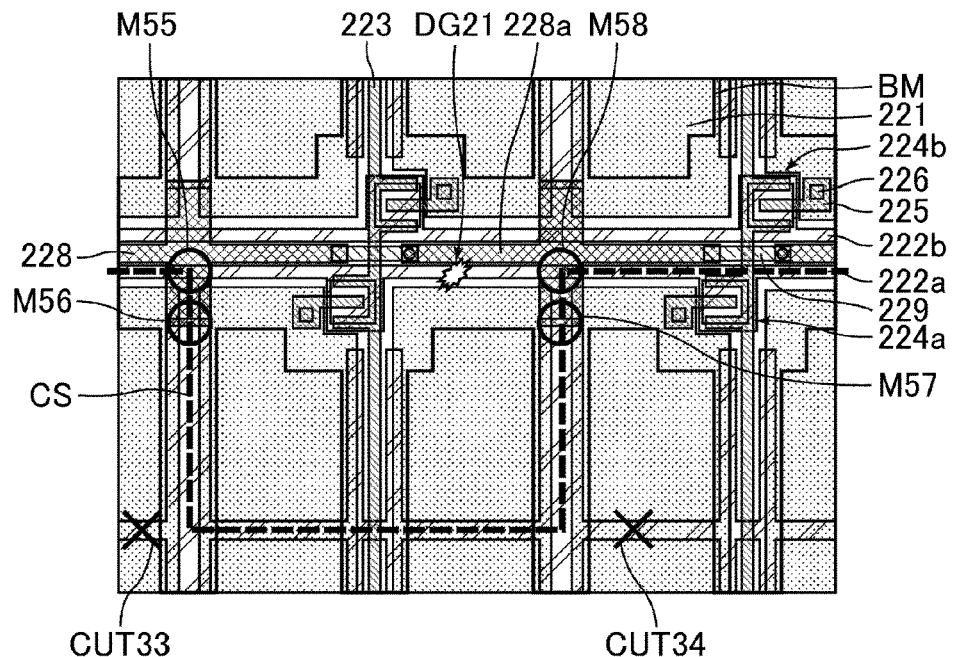
FIG. 20 is an enlarged schematic plan view of a circuit substrate of Embodiment 3-2.

FIG. 20 is an enlarged schematic plan view of a circuit substrate of Embodiment 3-2. Embodiment 3-2 represents a case of repairing a gate line 222a broken at a site DG21 with use of a storage capacitor line CS. In Embodiment 3-2, a repaired circuit indicated by a broken line in FIG. 20 was formed through the following process. That is, the storage capacitor lines were cut at a total of two sites, namely CUT33 and CUT34, by laser irradiation. By laser irradiation, the gate line 222a and the pattern film 228 were melted and electrically connected at a site M55, the pattern film 228 and a storage capacitor line CS were melted and electrically connected at a site M56, another storage capacitor line CS and a pattern film 228a were melted and electrically connected at a site M57, and the pattern film 228a and the gate line 222a were melted and electrically connected at a site M58 (four sites in total were subjected to melting and electrical conduction).

Embodiment 3-3

Figure 21:
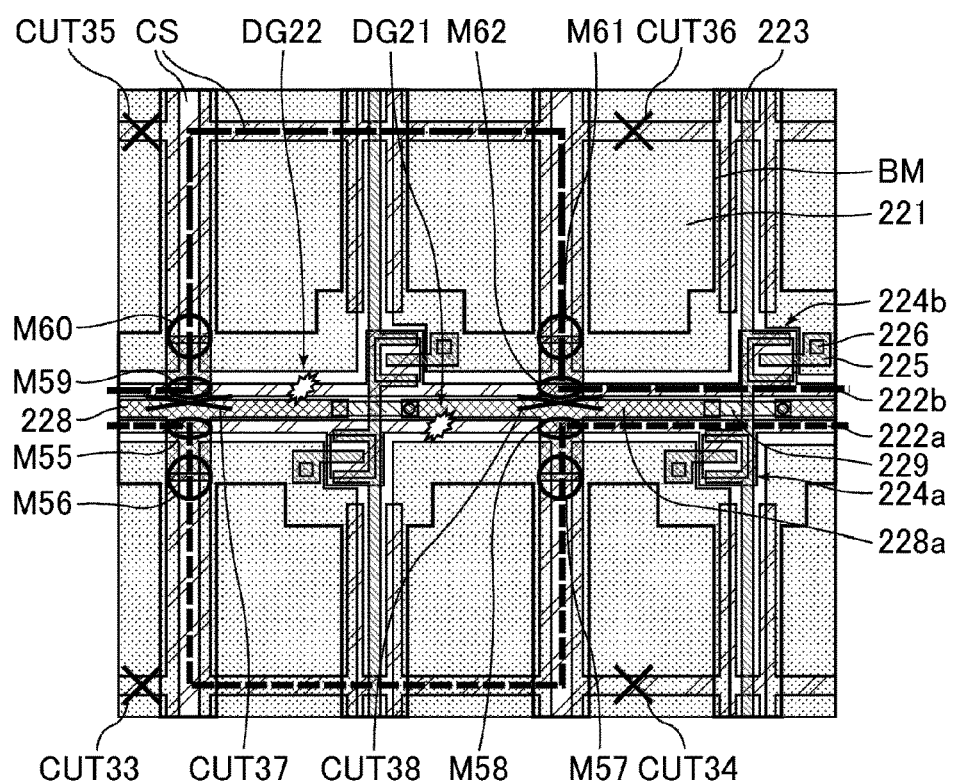
FIG. 21 is an enlarged schematic plan view of a circuit substrate of Embodiment 3-3.

FIG. 21 is an enlarged schematic plan view of a circuit substrate of Embodiment 3-3. Embodiment 3-3 represents a case of repairing simultaneously broken sites in the two respective conductive lines arranged in parallel, i.e., repairing the gate line 222a and the gate line 222b broken respectively at the site DG21 and the site DG22. In Embodiment 3-3, a repaired circuit indicated by a broken line in FIG. 21 was formed through the following process. That is, the components were cut at a total of six sites by laser irradiation, i.e., the storage capacitor lines CS were cut at CUT33, CUT34, CUT35, and CUT36, the pattern film 228 was cut at CUT37, and the pattern film 228a was cut at CUT38. Also, by laser irradiation, the gate line 222a and a pattern film 228 were melted and electrically connected at a site M55, the pattern film 228 and a storage capacitor line CS were melted and electrically connected at a site M56, another storage capacitor line CS and a pattern film 228a were melted and electrically connected at a site M57, and the pattern film 228a and the gate line 222a were melted and electrically connected at a site M58. Also, by laser irradiation, the gate line 222b and the pattern film 228 were melted and electrically connected at a site M59, the pattern film 228 and a storage capacitor line CS were melted and electrically connected at a site M60, another storage capacitor line CS and the pattern film 228a were melted and electrically connected at a site M61, and the pattern film 228a and the gate line 222b were melted and electrically connected at a site M62. The components were melted and electrically connected at a total of eight sites.

Alternative Example of Shape of Pattern Film in Embodiment 3

Although the linear portion of the pattern film in Embodiment 3 has a pattern shape of a quadrangle (tetragon) as illustrated in FIG. 19, the pattern shape of the pattern film 228 is not particularly limited if the pattern film overlaps an end portion of a linear portion of one of the storage capacitor lines, and the pattern shape may be, for example, a triangle, a semicircle, or a trapezoid.

Figure 22:
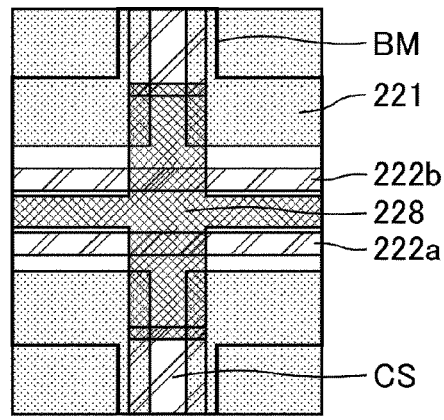
FIG. 22 is a schematic plan view illustrating the shape of a pattern film in Embodiment 3.
Figure 23:
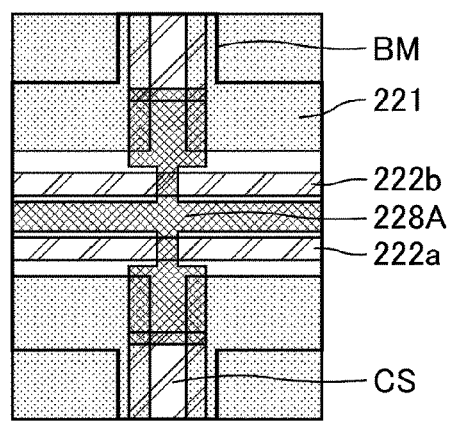
FIG. 23 is a schematic plan view illustrating an alternative example of the shape of the pattern film in Embodiment 3.
Figure 24:
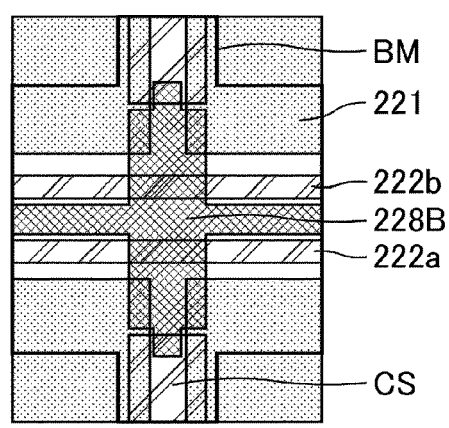
FIG. 24 is a schematic plan view illustrating an alternative example of the shape of the pattern film in Embodiment 3.
Figure 25:
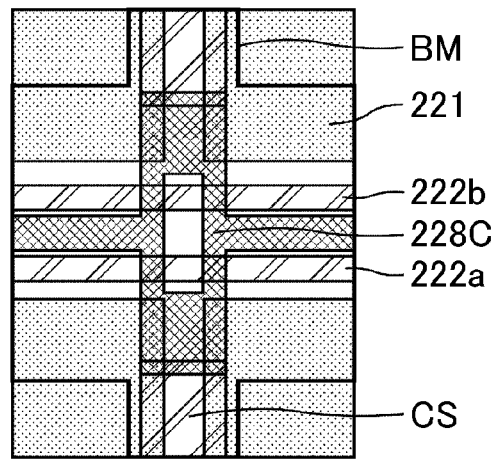
FIG. 25 is a schematic plan view illustrating an alternative example of the shape of the pattern film in Embodiment 3.

Alternative examples of the shape of the pattern film are described. The shape of the pattern film in Embodiment 3 is not particularly limited if the effects of the present invention can be achieved. FIG. 22 is a schematic plan view illustrating the shape of the pattern film in Embodiment 3. FIG. 23 to FIG. 25 are each a schematic plan view illustrating an alternative example of the shape of the pattern film in Embodiment 3.

The pattern film 228 illustrated in FIG. 22 has a large effect of increasing the light-shielding ratio.

The pattern film 228A (light-shielding metal) illustrated in FIG. 23 is narrow only at portions overlapping the gate lines 222a and 222b so that the capacitance between the gate lines 222a and 222b and the pattern film 228A (light-shielding metal) is low. Therefore, the capacitance between the gate lines 222a and 222b and the pattern film 228A (light-shielding metal) can be low, and the influence of the capacitance on the gate lines 222a and 222b can be small. Thereby, it is possible to sufficiently prevent a decrease in the display qualities because of signal delay or capacitance change.

The pattern film 228B illustrated in FIG. 24 has a large effect of increasing the light-shielding ratio, and can reduce the capacitance between the storage capacitor line Cs and the light-shielding metal (pattern film 228B). The pattern film 228B illustrated in FIG. 24 has a high light-shielding effect on the pattern film 228A illustrated in FIG. 23, and is thus advantageous in shielding a defect site in the light-shielding component from light. That is, a gap may be formed in the narrow portions of the pattern film 228A illustrated in FIG. 23, but the corresponding portions can be completely shielded from light in the pattern film 228B illustrated in FIG. 24.

The pattern film 228C illustrated in FIG. 25 has a design with redundancy, and can reduce the influence of the capacitance on the gate lines 222a and 222b, sufficiently preventing a decrease in the display qualities because of signal delay or capacitance change.

In Embodiment 3, from the viewpoint of electrically connecting the pattern film 228 and the storage capacitor lines CS by laser irradiation, the pattern film 228 is preferably formed to overlap the storage capacitor lines with an insulating film in between so that a region for laser irradiation can be provided. Specifically, the overlapping amount of the pattern film 228 and a storage capacitor line CS in a plan view of the main surface of the substrate is preferably 4 $\mu m^2$ or more. This is because the region to be melted by laser irradiation is desired to be at least about a 2 $\mu m \times 2$ $\mu m$ square. The upper limit for the overlapping amount is preferably 10 $\mu m^2$, for example. If the effects of the present invention can be achieved, not all the components are required to be laminated with an insulating film in between in overlapping portions, but it is suitable that the pattern film and the storage capacitor lines are laminated with an insulating film in between in substantially every overlapping portion.

Figure 26:
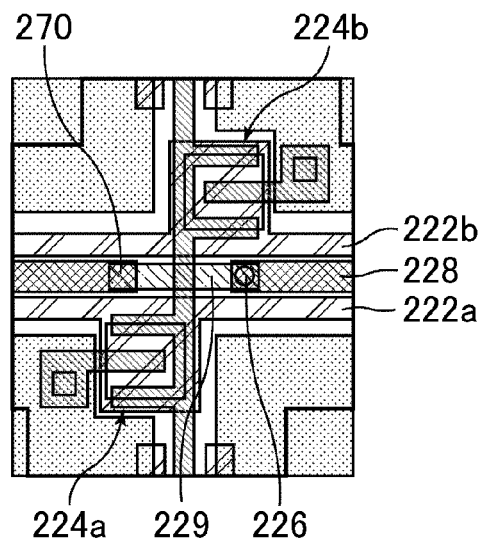
FIG. 26 is a schematic plan view illustrating electrical connection of a conductive material and a pattern film in a circuit substrate of Embodiment 3.

FIG. 26 is a schematic plan view illustrating electrical connection of a conductive material and a pattern film in the circuit substrate of Embodiment 3. Here, a protection film hole (contact hole 226) is formed only on one side of the conductive material 229, and the conductive material 229 and the pattern film 228 are electrically connected at this site. In a region 270, the conductive material 229 and the pattern film 228 are formed with a protection film (insulating film) in between, and thus they are not electrically connected. In such a case as in Embodiment 3, the number of times for cutting by laser irradiation for repairing broken conductive lines can be decreased as described above.

Figure 27:
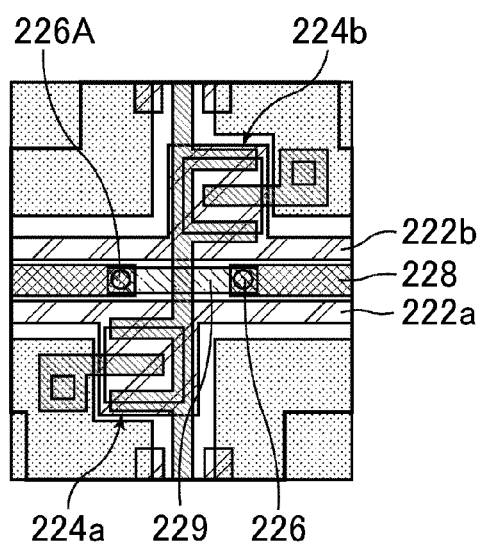
FIG. 27 is a schematic plan view illustrating electrical connection of a conductive material and a pattern film in a circuit substrate of an alternative example of Embodiment 3.

FIG. 27 is a schematic plan view illustrating electrical connection of a conductive material and a pattern film in the circuit substrate in an alternative example of Embodiment 3. The protection film hole is formed on each side of the conductive material 229. Specifically, a contact hole 226 is formed at one end portion of the conductive material 229, and a contact hole 226A is formed at the other end portion of the conductive material 229. The conductive material 229 and the pattern film 228 are electrically connected at these sites. Although the number of times for cutting by laser irradiation increases in repair of broken conductive lines in the case of such an alternative example of Embodiment 3, this structure may be employed, and the other effects described in Embodiment 3 can still be achieved.

The display device of Embodiment 3 also basically includes a TFT substrate (active matrix substrate) as a circuit substrate, a color filter substrate (counter substrate), and a display medium (e.g. liquid crystal) sandwiched between these two substrates.

The alignment mode and the alignment method for the liquid crystal and the method for driving the display are not limited (can be TN, MVA, IPS, FFS, TBA, PSA, photo alignment, or multi-pixel alignment). Also, the pixels may each have any shape such as a vertically long shape or a horizontally long shape, or may be in a delta arrangement.

In a circuit substrate with a dual gate structure, the pattern film is arranged in the source line layer per space between pixel rows. In the same manner as in Embodiment 1, repair lines can be formed using a conventional TFT structure layer (in the production step). Therefore, any new layer formation step (photolithography step) is not necessary, and thus the number of steps does not increase. Also, no new mask is required, and therefore the cost does not increase. When the pattern film arranged under the light-shielding component which does not influence the aperture ratio is used as repair lines for shielding a defect site in the light-shielding component, both the gate lines on both the upper and lower sides can be repaired. Furthermore, breakage of the gate lines at any site can be repaired.

The other suitable structures for Embodiment 3 are the same as the above-described suitable embodiments for Embodiment 1, and the embodiments can achieve the same effects as described above.

The number of sites where the components (e.g. conductive lines) are melted and electrically connected by laser irradiation, and the number of sites where the components (e.g. conductive lines) are cut by laser irradiation in Embodiment 3 are collectively shown in the following Table 3.

TABLE 3

| Embodiment 3 | | Melting (number of times) | Cutting (number of times) |
| --- | --- | --- | --- |
| Embodiment 3-1 | Repair of source wiring | 4 | 2 |
| Embodiment 3-2 | Repair of (one) gate wiring | 4 | 2 |
| Embodiment 3-3 | Repair of (two) gate wirings | 8 | 6 |

Embodiment 4: Structure in Which Pattern Film is Formed in New Layer in Space Between Pixel Rows In Embodiment 4, the pattern film (light-shielding metal) in a new layer extends along pixels in each space between pixel rows in the dual gate structure. The region in which the pattern film is arranged in Embodiment 4 is the largest among the regions in Embodiments 1 to 4. Hence, when a light-shielding conductive material such as a light-shielding metal is used as the pattern film, Embodiment 4 achieves the largest effect of shielding a defect site in the light-shielding component from light to prevent light leakage.

Embodiment 4-1

Figure 28:
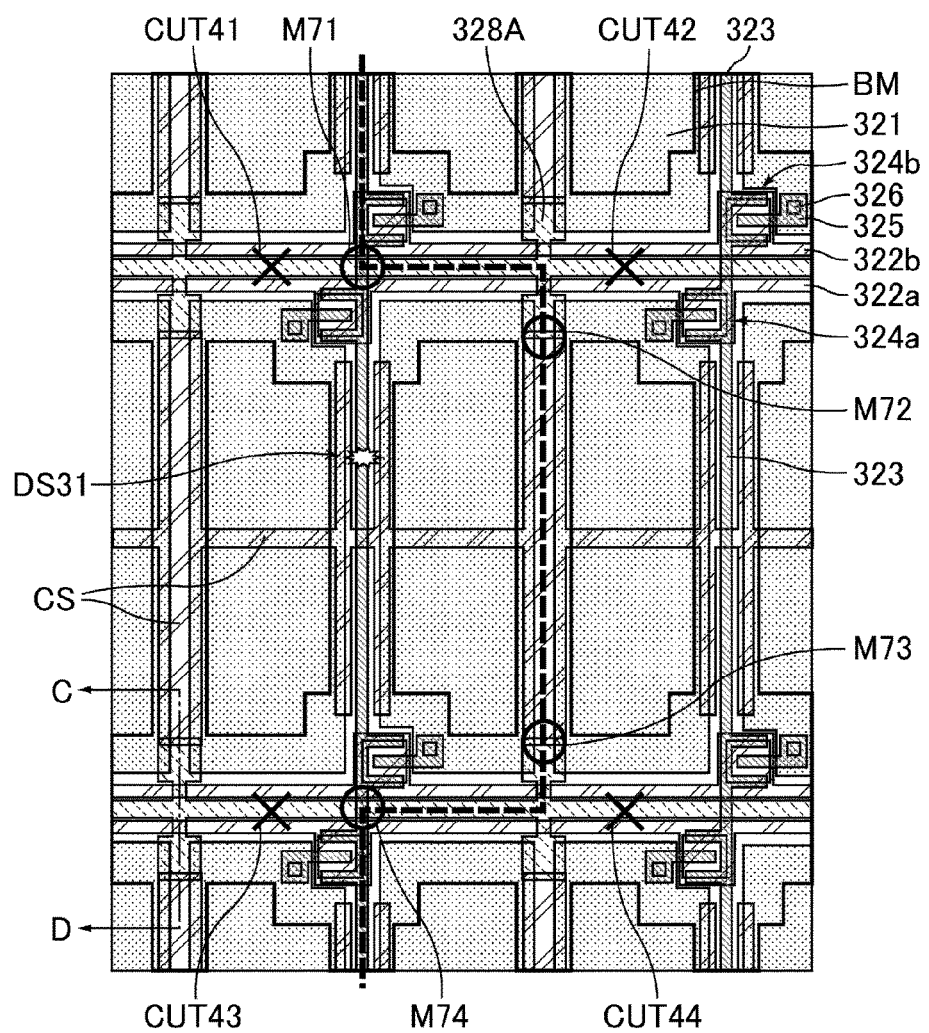
FIG. 28 is an enlarged schematic plan view of a circuit substrate of Embodiment 4-1.

FIG. 28 is an enlarged schematic plan view of a circuit substrate of Embodiment 4-1. Embodiment 4-1 represents a case of repairing a source line 323 broken at a site DS31. In Embodiment 4-1, a repaired circuit indicated by a broken line in FIG. 28 was formed through the following process. That is, a pattern film 328A was cut at a total of four sites, namely CUT41, CUT42, CUT43, and CUT44, by laser irradiation. Also, by laser irradiation, the source line 323 and the pattern film 328A were melted and electrically connected at a site M71, the pattern film 328A and a storage capacitor line CS were melted and electrically connected at a site M72, the storage capacitor line CS and the pattern film 328A were melted and electrically connected at a site M73, and the pattern film 328A and the source line 323 were melted and electrically connected at a site M74 (four sites in total were subjected to melting and electrical conduction).

Figure 29:
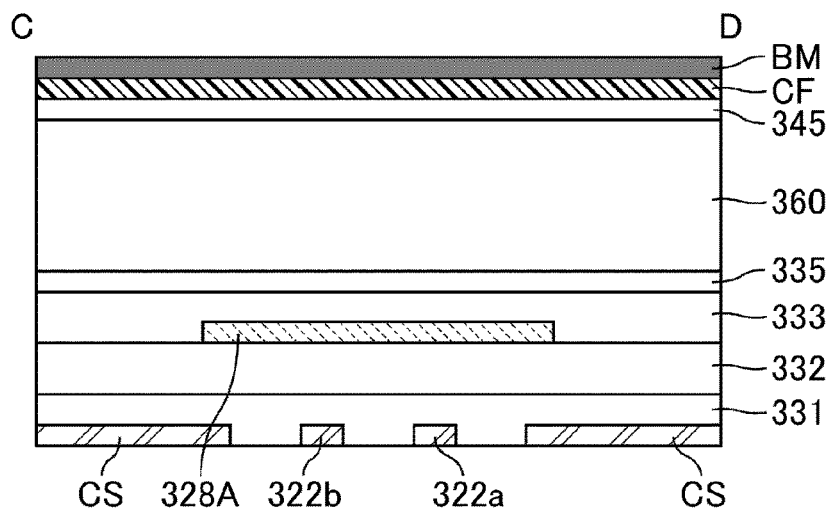
FIG. 29 is a schematic cross-sectional view illustrating a cross section obtained by cutting the circuit substrate illustrated in FIG. 28 along the line C-D.

FIG. 29 is a schematic cross-sectional view illustrating a cross section obtained by cutting the circuit substrate illustrated in FIG. 28 along the line C-D. FIG. 29 illustrates the circuit substrate before a repaired circuit is formed. The pattern film 328A overlaps the storage capacitor lines CS in pixels, at both ends of a linear portion thereof extending along the source lines. The thickness of a first insulating film 331 is preferably 3000 Å or larger. As for the upper limit, the thickness is preferably 5000 Å or smaller. The pattern film 328A, when irradiated with laser at each end, pushes the first insulating film 331 and a second insulating film 332 aside to reach the overlapping storage capacitor line CS, whereby the melted pattern film 328A and storage capacitor line CS are electrically connected to one another. In Embodiment 4-1, one insulating layer is added to the structure described in Embodiments 1 to 3, and the pattern film 328A is not in the same layer as the source lines. Accordingly, a pattern film extending along pixels can be formed per space between pixel columns.

Embodiment 4-2

Figure 30:
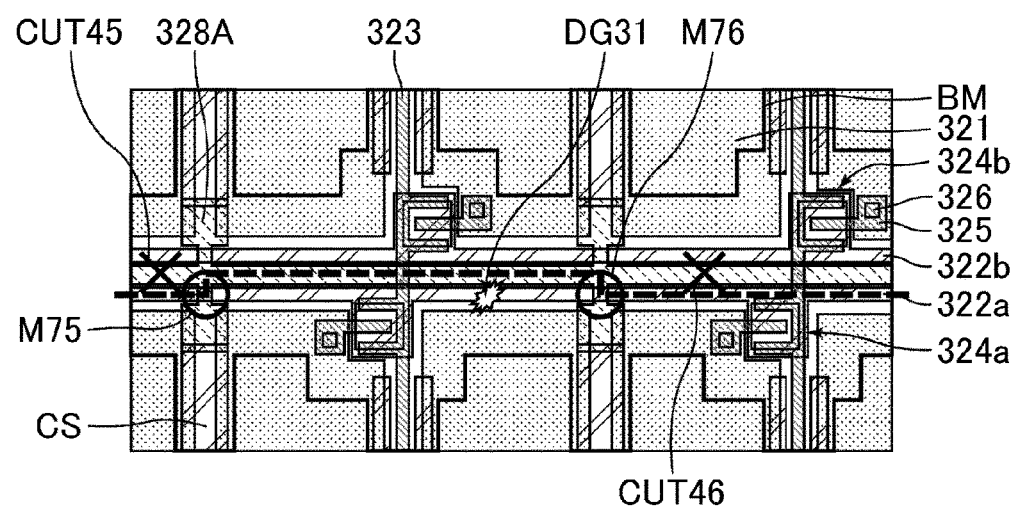
FIG. 30 is an enlarged schematic plan view of a circuit substrate of Embodiment 4-2.

FIG. 30 is an enlarged schematic plan view of a circuit substrate of Embodiment 4-2. Embodiment 4-2 represents a case of repairing a gate line 322a broken at a site DG31 without use of a storage capacitor line CS. In Embodiment 4-2, a repaired circuit indicated by a broken line in FIG. 30 was formed through the following process. That is, the pattern film 328A was cut at a total of two sites, namely CUT45 and CUT46, by laser irradiation. Also, by laser irradiation, the gate line 322a and the pattern film 328A were melted and electrically connected at a site M75, and the pattern film 328A and the gate line 322a were melted and electrically connected at a site M76 (two sites in total were subjected to melting and electrical conduction).

Embodiment 4-3

FIG. 31 is an enlarged schematic plan view of a circuit substrate of Embodiment 4-3. Embodiment 4-3 represents a case of repairing a gate line 322a broken at a site DG31 with use of a storage capacitor line CS. In Embodiment 4-3, a repaired circuit indicated by a broken line in FIG. 31 was formed through the following process. That is, the components were cut at a total of four sites by laser irradiation, i.e., the pattern film 328A was cut at CUT47 and CUT48, and the storage capacitor line was cut at CUT49 and CUT50. Also, by laser irradiation, the gate line 322a and a pattern film 328A were melted and electrically connected at a site M77, the pattern film 328A and a storage capacitor line CS were melted and electrically connected at a site M78, another storage capacitor line CS and the pattern film 328A were melted and electrically connected at a site M79, and the pattern film 328A and the gate line 322a were melted and electrically connected at a site M80 (four sites in total were subjected to melting and electrical conduction).

Embodiment 4-4

Figure 32:
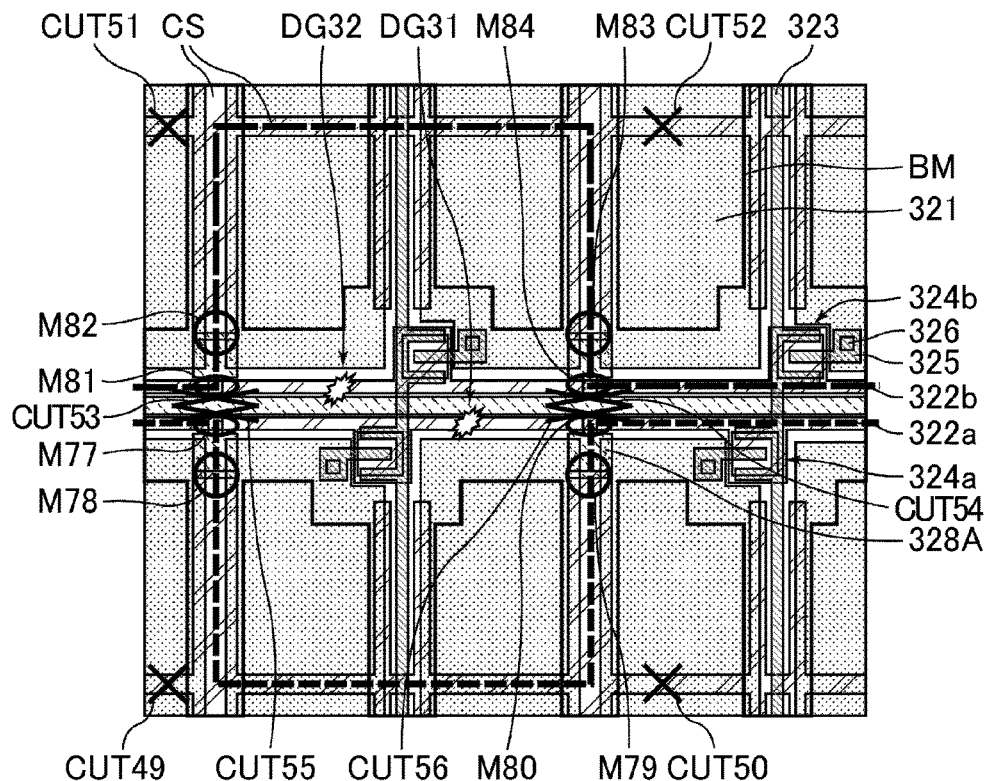
FIG. 32 is an enlarged schematic plan view of a circuit substrate of Embodiment 4-4.

FIG. 32 is an enlarged schematic plan view of a circuit substrate of Embodiment 4-4. Embodiment 4-4 represents a case of repairing simultaneously broken sites in the two respective gate lines arranged in parallel, i.e., repairing the gate line 322a and the gate line 322b broken respectively at the site DG31 and the site DG32. In Embodiment 4-4, a repaired circuit indicated by a broken line in FIG. 32 was formed through the following process. That is, the components were cut at a total of eight sites by laser irradiation, i.e., the storage capacitor lines CS were cut at CUT49, CUT50, CUT51, and CUT52, and the pattern film 328A was cut at CUT53, CUT54, CUT55, and CUT56. Also, by laser irradiation, the gate line 322a and the pattern film 328A were melted and electrically connected at a site M77, the pattern film 328A and a storage capacitor line CS were melted and electrically connected at a site M78, another storage capacitor line CS and the pattern film 328A were melted and electrically connected at a site M79, and the pattern film 328A and the gate line 322a were melted and electrically connected at a site M80. Also, by laser irradiation, the gate line 322b and the pattern film 328A were melted and electrically connected at a site M81, the pattern film 328A and a storage capacitor line CS were melted and electrically connected at a site M82, another storage capacitor line CS and the pattern film 328A were melted and electrically connected at a site M83, and the pattern film 328A and the gate line 322b were melted and electrically connected at a site M84. The components were melted and electrically connected at a total of eight sites. In Embodiment 4-4, the pattern film 328A is cut on the upper and lower sides (e.g. two sites at CUT53 and CUT55) as illustrated in FIG. 32, so that the unnecessary portions of the pattern film are cut away from the repaired signal transfer route. Thereby, the electrical potential of one gate line and the electrical potential of the pattern film between gate lines are equalized, and thus it is possible to prevent the pattern film from being continuously charged from the gate lines by forming a conductive line parallel to the gate lines. Accordingly, this embodiment is more preferred than the case of cutting the pattern film only at one site on either one of the upper and lower sides.

Alternative Example of Shape of Pattern Film in Embodiment 4

The pattern shape of the pattern film 328A in Embodiment 4 is not particularly limited if the pattern film overlaps an end portion of a linear portion of one of the storage capacitor lines, and the pattern shape may be, for example, a quadrangle (tetragon), a triangle, a semicircle, or a trapezoid.

Figure 33:
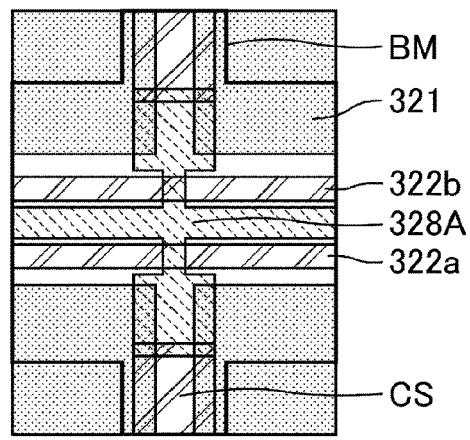
FIG. 33 is a schematic plan view illustrating the shape of a pattern film in Embodiment 4.
Figure 34:
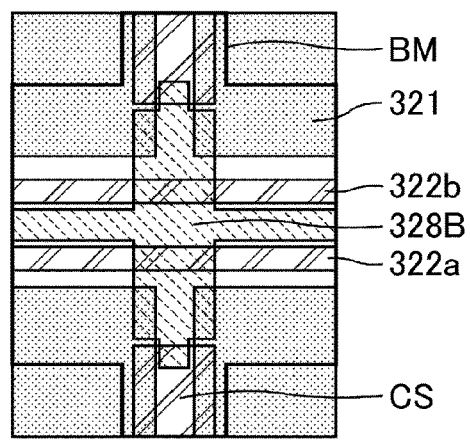
FIG. 34 is a schematic plan view illustrating an alternative example of the shape of the pattern film in Embodiment 4.
Figure 35:
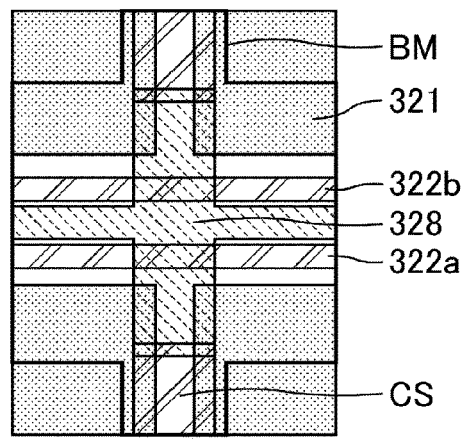
FIG. 35 is a schematic plan view illustrating an alternative example of the shape of the pattern film in Embodiment 4.
Figure 36:
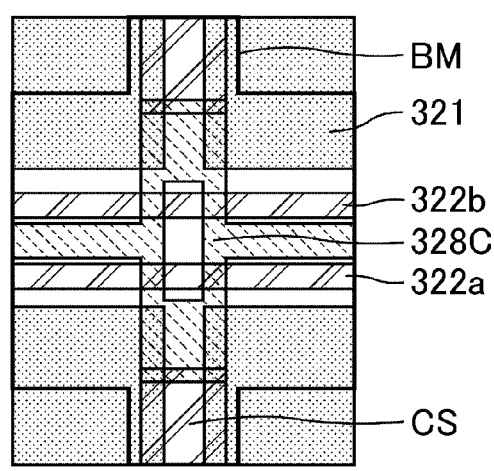
FIG. 36 is a schematic plan view illustrating an alternative example of the shape of the pattern film in Embodiment 4.

Alternative examples of the shape of the pattern film are described. The shape of the pattern film in Embodiment 4 is not particularly limited if the effects of the present invention can be achieved. FIG. 33 is a schematic plan view illustrating the shape of the pattern film in Embodiment 4. FIG. 34 to FIG. 36 are each a schematic plan view illustrating an alternative example of the shape of the pattern film in Embodiment 4.

The pattern film 328A (light-shielding metal) illustrated in FIG. 33 is narrow only at portions overlapping the gate lines 322a and 322b so that the capacitance between the gate lines 322a and 322b, and the pattern film 328A (light-shielding metal) is low. Therefore, the capacitance between the gate lines 322a and 322b and the pattern film 328A (light-shielding metal) can be low, and the influence of the capacitance on the gate lines 322a and 322b can be small. Thereby, it is possible to sufficiently prevent a decrease in the display qualities because of signal delay or capacitance change.

The pattern film 328B illustrated in FIG. 34 has a large effect of increasing the light-shielding ratio, and can reduce the capacitance between the storage capacitor line CS and the light-shielding metal (pattern film 328B). The pattern film 328B illustrated in FIG. 34 has a high light-shielding effect on the pattern film 328A illustrated in FIG. 33, and is thus advantageous in shielding a defect site in the light-shielding component from light. That is, a gap may be formed in the narrow portions of the pattern film 328A illustrated in FIG. 33, but the narrow portions can be completely shielded from light in the pattern film 328B illustrated in FIG. 34.

The pattern film 328 illustrated in FIG. 35 has a large effect of increasing the light-shielding ratio.

The pattern film 328C illustrated in FIG. 36 has a design with redundancy, and can reduce the influence of the capacitance on the gate lines 322a and 322b, sufficiently preventing a decrease in the display qualities because of signal delay or capacitance change.

In Embodiment 4, from the viewpoint of electrically connecting the pattern film 328A and the storage capacitor lines CS by laser irradiation, the pattern film 328A is preferably formed to overlap the storage capacitor lines with an insulating film in between so that a region for laser irradiation can be provided. Specifically, the overlapping amount of the pattern film 328A and a storage capacitor line CS in a plan view of the main surface of the substrate is preferably 4 µm² or more. This is because the region to be melted by laser irradiation is desired to be at least about a 2 µm×2 µm square. The upper limit for the overlapping amount is preferably 10 µm², for example. If the effects of the present invention can be achieved, not all the components are required to be laminated with an insulating film in between in overlapping portions, but it is suitable that the pattern film and the storage capacitor lines are laminated with an insulating film in between in substantially every overlapping portion.

The display device of Embodiment 4 also basically includes a TFT substrate (active matrix substrate) as a circuit substrate, a color filter substrate (counter substrate), and a display medium (e.g. liquid crystal) sandwiched between these two substrates.

The alignment mode and the alignment method for the liquid crystal and the method for driving the display are not limited (can be TN, MVA, IPS, FFS, TBA, PSA, photo alignment, or multi-pixel alignment). Also, the pixels may each have any shape such as a vertically long shape or a horizontally long shape, or may be in a delta arrangement.

In a circuit substrate with a dual gate structure, the pattern film is arranged in a different layer from the source line layer per space between pixel rows. Thereby, a pattern film extending along the pixels can be formed per space between pixel rows. As described above, the effect of shielding a defect site in the light-shielding component from light is the largest here. When the pattern film arranged under the light-shielding component which does not influence the aperture ratio is used as repair lines for shielding a defect site in the light-shielding component, both the gate lines on both the upper and lower sides can be repaired. Furthermore, breakage of the gate lines at any site can be repaired.

The other suitable structures for Embodiment 4 are the same as the above-described suitable embodiments for Embodiment 1, and the embodiments can achieve the same effects as described above.

The number of sites where the components (e.g. conductive lines) are melted and electrically connected by laser irradiation, and the number of sites where the components (e.g. conductive lines) are cut by laser irradiation in Embodiment 4 are collectively shown in the following Table 4.

TABLE 4

|  |  | Melting (number of times) | Cutting (number of times) |
| --- | --- | --- | --- |
| Embodiment 4-1 | Repair of source wiring | 4 | 4 |
| Embodiment 4-2 | Repair of (one) gate wiring Without use of storage capacitor wiring | 2 | 2 |
| Embodiment 4-3 | Repair of (one) gate wiring With use of storage capacitor wiring | 4 | 4 |
| Embodiment 4-4 | Repair of (two) gate wirings | 8 | 8 |

Other Embodiments

The circuit substrate of the present invention is typically used for a display device in which an image is formed with pixels.

The present invention utilizes the light-shielding metal originally arranged to cover a defect in the light-shielding component when the defect is generated. Hence, the aperture ratio does not decrease at all, and the present invention can therefore save the energy and provide a high transmittance.

The structure of the circuit substrate or the display device can be identified by observing the circuit substrate or the display device by a microscope.

Other Suitable Embodiments

In each of the embodiments of the present invention, oxide semiconductor TFTs (an In—Ga—Zn—O semiconductor is particularly preferred) are suitable. The effect of combining oxide semiconductor TFTs and a dual gate structure is described in detail below.

(1) The oxide semiconductor TFTs have a higher ON-state current than amorphous silicon (a-Si) TFTs. Therefore, even when the number of gate lines is doubled in the dual gate structure, the oxide semiconductor can suitably function with the number of pixels achieving a higher definition.

(2) The oxide semiconductor TFTs have a higher ON-state current and a lower OFF-state current than a-Si TFTs. Therefore, even when the number of gate lines is doubled in a dual gate structure, the present invention can provide a driving-off period (period during which the driving is stopped after one frame), leading to a low power consumption.

If a sensing period for a touch panel is provided in the off period, the noise of the touch panel is reduced, i.e., the precision is high.

Modes commonly applicable to the above respective embodiments are described below.

The pattern film may be cut to remove unnecessary conductive lines for reduction of the capacitance (since a pattern film widely overlapping the gate lines is not arranged, the pattern film can be cut).

In order to increase the transmittance, a metal with a high reflectance (e.g. aluminum, aluminum alloy) is preferably used.

The repair lines crossing the conductive lines may be designed to be narrow only at the crossing portions. In order to reduce the capacitance in the panel, this embodiment is preferred (e.g. FIG. 7, FIG. 9, FIG. 16, FIG. 18, FIG. 23, FIG. 25, FIG. 33, FIG. 36).

In the above embodiments, two gate lines are arranged side by side per space between pixel rows, but additional gate lines may be further arranged if the effects of the present invention can be achieved. Also, in place of the two gate lines per space between pixel rows, other two conductive lines such as two source lines may be arranged side by side per space between pixel rows.

The above structures may be appropriately combined as long as the combination does not go beyond the scope of the present invention.

REFERENCE SIGNS LIST 21, 121, 221, 321: Pixel electrode
22a, 22b, 122a, 122b, 222a, 222b, 322a, 322b: Gate line
23, 123, 223, 323: Source line
24a, 24b, 124a, 124b, 224a, 224b, 324a, 324b: Thin-film transistor (TFT) element
25, 125, 225, 325: Drain lead-out line
26, 226, 226A: Contact hole
28, 28a, 28A, 28B, 28C, 128, 128a, 128A, 128B, 128C, 228, 228a, 228A, 228B, 228C, 328, 328A, 328B, 328C: Repair line (pattern film)
31, 331: First insulating layer
32, 332: Second insulating layer
35, 45, 335, 345: Alignment film
129, 229: Conductive material
60, 360: Liquid crystal layer
BM: Black matrix (outside the region surrounded by the thick line)
CF: Color filter
CS: Storage capacitor line

The invention claimed is:

1. A circuit substrate, comprising:
a plurality of pixel electrodes in a matrix;
a plurality of first conductive lines;
a plurality of second conductive lines crossing the plurality of first conductive lines;
a plurality of storage capacitor lines extending in a first direction in which the plurality of first conductive lines extend;
a plurality of thin-film transistors each including a drain electrode; and
a pattern film, wherein
the plurality of pixel electrodes are electrically connected to respective ones of the drain electrodes of the plurality of thin-film transistors,
the plurality of first conductive lines are in spaces between neighboring pixel rows, with two of the plurality of first conductive lines per space between the neighboring pixel rows,
the plurality of second conductive lines are in spaces between neighboring pixel columns, with one of the plurality of second conductive lines in every other space between the neighboring pixel columns,
the plurality of storage capacitor lines each include a linear portions that extends in a second direction in which the plurality of second conductive lines extend, in spaces between the neighboring pixel columns where the plurality of second conductive lines are not located,
the pattern film includes, in a plan view of the substrate, first linear portions extending in the second direction, in the spaces between the neighboring pixel rows, the first linear portions each including one end portion overlapping an end portion of the linear portion of one of the plurality of storage capacitor lines and another end portion overlapping the end portion of the linear portion of another of the plurality of storage capacitor lines.

2. The circuit substrate according to claim 1, further comprising an insulating film, wherein two ends of each of the first linear portions of the pattern film each overlap the end portion of the linear portion of one of the plurality of storage capacitor lines with the insulating film in between.

3. The circuit substrate according to claim 1, wherein the pattern film further comprises second linear portions extending in the first direction.

4. The circuit substrate according to claim 3, further comprising a conductive material, wherein
the conductive material has a linear shape extending in the first direction, and
the conductive material includes ends each overlapping one of the second linear portions of the pattern film.

5. The circuit substrate according to claim 4, wherein the conductive material is separate from the pattern film by an insulating film.

6. The circuit substrate according to claim 4, wherein
one of the ends of the conductive material is electrically connected to the one of the second linear portions of the pattern film through a contact hole,
and
the other of the ends of the conductive material is separate from the pattern film by an insulating film.

7. The circuit substrate according to claim 4, wherein each of the ends of the conductive material is electrically connected to the one of the second linear portions of the pattern film through a contact hole.

8. The circuit substrate according to claim 4, wherein
the plurality of pixel electrodes are transparent, and
the conductive material is made of a same material as the plurality of pixel electrodes.

9. The circuit substrate according to claim 1, wherein
the pattern film is in a different layer from the plurality of second conductive lines, and
the pattern film crosses the plurality of second conductive lines in the plan view of the substrate.

10. The circuit substrate according to claim 1, wherein
one of: (i) a set of the plurality of first conductive lines and (ii) a set of the plurality of second conductive lines is a set of gate lines, and
a remaining one of: (i) the set of the plurality of first conductive lines and (ii) the set of the plurality of second conductive lines is a set of source lines.

11. The circuit substrate according to claim 1, wherein the pattern film includes a material selected from the group consisting of Al, Cr, Ta, Ti, W, Mo, and Cu.

12. The circuit substrate according to claim 1, wherein the plurality of thin-film transistors each include an oxide semiconductor.

13. The circuit substrate according to claim 1, wherein
a first of the two of the plurality of first conductive lines in the spaces between the neighboring pixel rows is electrically connected to a gate electrode of one of the plurality of thin-film transistors of a pixel in an odd-numbered one of the neighboring pixel columns, and
a second of the two of the plurality of first conductive lines in the spaces between the neighboring pixel rows is electrically connected to a gate electrode of one of the plurality of thin-film transistors of a pixel in an even-numbered one of the neighboring pixel columns.

14. The circuit substrate according to claim 1, wherein
one of the two of the plurality of first conductive lines in one of the spaces between the neighboring pixel rows, is electrically connected to a gate electrode of one of the plurality of thin-film transistors of a pixel in an odd-numbered one of the neighboring pixel columns; and
the other of the two of the plurality of first conductive lines in the one of the spaces between the neighboring pixel rows, is electrically connected to a gate electrode of one of the plurality of thin-film transistors of a pixel in an even-numbered one of the neighboring pixel columns.

15. A display device, comprising:
a circuit substrate comprising:
a plurality of pixel electrodes in a matrix;
a plurality of first conductive lines;
a plurality of second conductive lines crossing the plurality of first conductive lines;
a plurality of storage capacitor lines extending in a first direction in which the plurality of first conductive lines extend;
a plurality of thin-film transistors each including a drain electrode; and
a pattern film, wherein
the plurality of pixel electrodes are electrically connected to respective ones of the drain electrodes of the plurality of thin-film transistors,
the plurality of first conductive lines are in spaces between neighboring pixel rows, with two of the plurality of first conductive lines per space between the neighboring pixel rows,
the plurality of second conductive lines are in spaces between neighboring pixel columns, with one of the plurality of second conductive lines in every other space between the neighboring pixel columns,
the plurality of storage capacitor lines each include a linear portions that extends in a second direction in which the plurality of second conductive lines extend, in spaces between the neighboring pixel columns where the plurality of second conductive lines are not located,
the pattern film includes, in a plan view of the substrate, first linear portions extending in the second direction, in the spaces between the neighboring pixel rows, the first linear portions each including one end portion overlapping an end portion of the linear portion of one of the plurality of storage capacitor lines and another end portion overlapping an the end portion of the linear portion of another of the plurality of storage capacitor lines;
a counter substrate; and
a display medium sandwiched between the circuit substrate and the counter substrate.

* * * * *